United States Patent
Iwasaki et al.

(10) Patent No.: US 10,014,368 B2
(45) Date of Patent: Jul. 3, 2018

(54) SEMICONDUCTOR DEVICE AND MANUFACTURING METHOD OF SEMICONDUCTOR DEVICE

(71) Applicant: TOYOTA JIDOSHA KABUSHIKI KAISHA, Toyota-shi, Aichi-ken (JP)

(72) Inventors: Shinya Iwasaki, Toyota (JP); Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 42 days.

(21) Appl. No.: 15/102,577

(22) PCT Filed: Nov. 19, 2014

(86) PCT No.: PCT/JP2014/080677
§ 371 (c)(1),
(2) Date: Jun. 8, 2016

(87) PCT Pub. No.: WO2015/098377
PCT Pub. Date: Jul. 2, 2015

(65) Prior Publication Data
US 2016/0315140 A1    Oct. 27, 2016

(30) Foreign Application Priority Data

Dec. 27, 2013 (JP) ................................. 2013-271726
Aug. 7, 2014 (JP) ................................. 2014-161668

(51) Int. Cl.
*H01L 29/74* (2006.01)
*H01L 29/06* (2006.01)
(Continued)

(52) U.S. Cl.
CPC .......... *H01L 29/063* (2013.01); *H01L 21/263* (2013.01); *H01L 21/265* (2013.01);
(Continued)

(58) Field of Classification Search
None
See application file for complete search history.

(56) References Cited

U.S. PATENT DOCUMENTS 5,808,352 A    9/1998    Sakamoto
5,945,692 A    8/1999    Yano et al.
(Continued)

FOREIGN PATENT DOCUMENTS

CN    1700430 A    11/2005
CN    102856381 A    1/2013
(Continued)

*Primary Examiner* — Shaun Campbell
(74) *Attorney, Agent, or Firm* — Oliff PLC

(57) ABSTRACT

An IGBT region includes a collector layer, a first drift layer, a first body layer, an emitter layer, and a trench gate reaching the first drift layer through the first body layer from a front surface side of a semiconductor substrate. A diode region includes a cathode layer, a second drift layer, and a second body layer. A lifetime control region which includes a peak of a crystal defect density is provided in the first drift layer and the second drift layer that are located between a depth of a lower end of the trench gate and surfaces of the first drift layer and the second drift layer. A silicon nitride film is further provided above the trench gate on the front surface side of the semiconductor substrate.

2 Claims, 23 Drawing Sheets

(51) Int. Cl.
*H01L 21/263* (2006.01)
*H01L 29/32* (2006.01)
*H01L 29/739* (2006.01)
*H01L 29/08* (2006.01)
*H01L 29/66* (2006.01)
*H01L 21/265* (2006.01)
*H01L 21/322* (2006.01)
*H01L 29/423* (2006.01)
*H01L 21/28* (2006.01)
*H01L 21/324* (2006.01)
*H01L 29/78* (2006.01)
*H01L 27/06* (2006.01)
*H01L 29/10* (2006.01)
*H01L 29/861* (2006.01)
*H01L 27/07* (2006.01)

(52) U.S. Cl.
CPC ........ *H01L 21/26506* (2013.01); *H01L 21/28* (2013.01); *H01L 21/322* (2013.01); *H01L 21/324* (2013.01); *H01L 21/3223* (2013.01); *H01L 27/0664* (2013.01); *H01L 27/0727* (2013.01); *H01L 29/0696* (2013.01); *H01L 29/0834* (2013.01); *H01L 29/1095* (2013.01); *H01L 29/32* (2013.01); *H01L 29/4236* (2013.01); *H01L 29/6609* (2013.01); *H01L 29/66348* (2013.01); *H01L 29/7397* (2013.01); *H01L 29/78* (2013.01); *H01L 29/861* (2013.01)

(56) References Cited

U.S. PATENT DOCUMENTS

| | | |
|---|---|---|
| 2001/0001494 A1 | 5/2001 | Kocon |
| 2005/0255706 A1* | 11/2005 | Ishida .............. H01L 21/3003 438/758 |
| 2007/0108468 A1 | 5/2007 | Takahashi |
| 2008/0079007 A1 | 4/2008 | Morita et al. |
| 2008/0203441 A1 | 8/2008 | Endo |
| 2009/0242931 A1* | 10/2009 | Tsuzuki ............ H01L 29/167 257/143 |
| 2009/0278166 A1* | 11/2009 | Soeno .............. H01L 27/0664 257/133 |
| 2009/0280654 A1 | 11/2009 | Wu et al. |
| 2013/0001677 A1 | 1/2013 | Okaji |

FOREIGN PATENT DOCUMENTS

| | | |
|---|---|---|
| JP | H08-227895 A | 9/1996 |
| JP | 2000-299464 A | 10/2000 |
| JP | 2001-284600 A | 10/2001 |
| JP | 2002-329727 A | 11/2002 |
| JP | 2007-134625 A | 5/2007 |
| JP | 2008-085251 A | 4/2008 |
| JP | 2008-244456 A | 10/2008 |
| JP | 2009-267394 A | 11/2009 |
| JP | 2009-272550 A | 11/2009 |
| JP | 2009-272594 A | 11/2009 |
| JP | 2011-238872 A | 11/2011 |
| JP | 2013-012530 A | 1/2013 |

* cited by examiner

SEMICONDUCTOR DEVICE AND MANUFACTURING METHOD OF SEMICONDUCTOR DEVICE

TECHNICAL FIELD

This application claims priority to Japanese Patent Application No. 2013-271726 filed on Dec. 27, 2013, and Japanese Patent Application No. 2014-161668 filed on Aug. 7, 2014, the entire contents of which are hereby incorporated by reference into the present application. A technology disclosed herein relates to a semiconductor device and a manufacturing method of the semiconductor device.

BACKGROUND ART

Japanese Patent Application Publication No. 2011-238872 A discloses a semiconductor device including a semiconductor substrate in which an IGBT region and a diode region are provided. This semiconductor device includes a lifetime control region provided across the IGBT region and the diode region. The lifetime control region includes a peak of a crystal defect density at a position in a drift layer that is deeper than a lower end of a trench gate provided in the IGBT region. The lifetime control region improves a reverse recovery characteristics of the diode region.

SUMMARY OF INVENTION

Technical Problem

For improvement in the reverse recovery characteristics of the diode region, it is preferable that the lifetime control region be provided at a position in the drift layer that is as close as possible to a boundary between a body layer and the drift layer. The provision of the lifetime control region at such a position causes an overlap between a position at which the trench gate is provided and the position at which the lifetime control region is provided. This results in formation of an interface state between a gate insulating film of the trench gate and a portion of the semiconductor substrate that is in contact with the gate insulating film. Since the interface state captures carriers, a plurality of the trench gates has different threshold voltages from each other, so that there is a greater deal of variation in a threshold voltage of each of the trench gates.

Solution of Technical Problem

A first semiconductor device disclosed herein comprises a semiconductor substrate in which an IGBT region and a diode region are provided, an interlayer insulating film and a front surface electrode that are provided on a front surface of the semiconductor substrate, and a back surface electrode provided on a back surface of the semiconductor substrate. The IGBT region comprises a collector layer of a first conductivity type, a first drift layer of a second conductivity type provided on a front surface side of the semiconductor substrate relative to the collector layer, a first body layer of the first conductivity type provided on the front surface side of the semiconductor substrate relative to the first drift layer and partially exposed on the front surface of the semiconductor substrate, an emitter layer of the second conductivity type provided on a front surface of the first body layer and exposed on the front surface of the semiconductor substrate, and a trench gate reaching the first drift layer through the first body layer from the front surface side of the semiconductor substrate. The diode region comprises, a cathode layer of the second conductivity type, a second drift layer of the second conductivity type provided on the front surface side of the semiconductor substrate relative to the cathode layer and having a lower impurity concentration of the second conductivity type than that of the cathode layer, and a second body layer of the first conductivity type provided on the front surface side of the semiconductor substrate relative to the second drift region. The interlayer insulating film insulates the trench gate and the front surface electrode. A lifetime control region which includes a peak of a crystal defect density is provided in the first drift layer and the second drift layer that are located between a depth of a lower end of the trench gate and surfaces of the first drift layer and the second drift layer. A silicon nitride film is further provided above the trench gate on the front surface side of the semiconductor substrate.

It should be noted that a front surface of the first drift layer means a boundary surface between the first drift layer and the first body layer. Further, a front surface of the second drift layer means a boundary surface between the second drift layer and the second body layer. Further, the "peak of a crystal defect density" means the local maximum value of a crystal defect density distribution in a depth direction in the first drift region or the second drift region. Further, it is preferable that the "peak of a crystal defect density" be the maximum value in the crystal defect density distribution.

The first semiconductor device reduces the variations in the threshold voltage of the trench gates, as hydrogen atoms are supplied from the silicon nitride film provided above the trench gate on the front surface side of the semiconductor substrate and an interface state is terminated and reduced by hydrogen. This makes it possible to both reduce the variations in the threshold voltage of the trench gates and improve the reverse recovery characteristics of the diode region.

In the semiconductor device, the silicon nitride film may be provided above the emitter layer. Furthermore, the silicon nitride film may comprise an opening opened above a portion of the first body layer that is exposed on the front surface of the semiconductor substrate.

A second semiconductor device disclosed herein comprises a semiconductor substrate in which an IGBT region and a diode region are provided, an interlayer insulating film and a front surface electrode that are provided on a front surface of the semiconductor substrate, and a back surface electrode provided on a back surface of the semiconductor substrate. The IGBT region comprises, a collector layer of a first conductivity type, a first drift layer of a second conductivity type provided on a front surface side of the semiconductor substrate relative to the collector layer, a first body layer of the first conductivity type provided on the front surface side of the semiconductor substrate relative to the first drift layer and partially exposed on the front surface of the semiconductor substrate, an emitter layer of the second conductivity type provided on a front surface of the first body layer and exposed on the front surface of the semiconductor substrate, and a trench gate reaching the first drift layer through the first body layer from the front surface side of the semiconductor substrate. The diode region comprises a cathode layer of the second conductivity type, a second drift layer of the second conductivity type provided on the front surface side of the semiconductor substrate relative to the cathode layer and having a lower impurity concentration of the second conductivity type than that of the cathode layer, and a second body layer of the first conductivity type provided on the front surface side of the semiconductor substrate relative to the second drift region. The interlayer insulating film insulates the trench gate and the front surface electrode. A lifetime control region which includes a peak of a crystal defect density is provided in the first drift layer and the second drift layer that are located between a depth of a lower end of the trench gate and surfaces of the first drift layer and the second drift layer. The front surface electrode includes an Al based electrode layer and a barrier metal layer. The barrier metal layer is provided between a portion of the first body layer that is exposed on the front surface of the semiconductor substrate and the Al based electrode layer, and not provided between the trench gate and the Al based electrode layer.

The second semiconductor device reduces the variations in the threshold voltage of the trench gates, as the interface state is terminated and reduced by hydrogen atoms being supplied from the Al based electrode layer. Further, the barrier metal layer, to which hydrogen atoms are easily adsorbed, is provided between the portion of the first body layer that is located comparatively away from the trench gate, to which hydrogen atoms are supplied, and exposed on the front surface of the semiconductor substrate and the Al based electrode layer, and is not provided between the trench gate, to which hydrogen atoms are supplied, and the Al based electrode layer. For this reason, the supply of hydrogen atoms from the Al based electrode layer to the trench gate is not prevented by the barrier metal layer. The provision of the barrier metal layer makes it possible to supply hydrogen atoms to the trench gate while ensuring effects that are brought about by providing the barrier metal layer, thus making it possible to both reduce the variations in the threshold voltage of the trench gates and improve the reverse recovery characteristics of the diode region.

Further, a manufacturing method of a semiconductor device that comprises a semiconductor substrate in which an IGBT region and a diode region are formed, an interlayer insulating film and a front surface electrode that are formed on a front surface of the semiconductor substrate, and a back surface electrode formed on a back surface of the semiconductor substrate is herein provided. The IGBT region comprises, a collector layer of a first conductivity type, a first drift layer of a second conductivity type provided on a front surface side of the semiconductor substrate relative to the collector layer, a first body layer of the first conductivity type provided on the front surface side of the semiconductor substrate relative to the first drift layer and partially exposed on the front surface of the semiconductor substrate, an emitter layer of the second conductivity type provided on a front surface of the first body layer and exposed on the front surface of the semiconductor substrate, and a trench gate reaching the first drift layer through the first body layer from the front surface side of the semiconductor substrate. The diode region comprises a cathode layer of the second conductivity type, a second drift layer of the second conductivity type provided on the front surface side of the semiconductor substrate relative to the cathode layer and having a lower impurity concentration of the second conductivity type than that of the cathode layer, and a second body layer of the first conductivity type provided on the front surface side of the semiconductor substrate relative to the second drift region. The interlayer insulating film insulates the trench gate and the front surface electrode. A lifetime control region which includes a peak of a crystal defect density is formed in the first drift layer and the second drift layer that are located between a depth of a lower end of the trench gate and surfaces of the first drift layer and the second drift layer. The manufacturing method comprises forming the trench gate in the semiconductor substrate, forming a silicon nitride film on a front surface side of the trench gate, irradiating charged particles on a region located between a depth of a lower end of the trench gate and surfaces of the first drift layer and the second drift layer in a state in which the silicon nitride film is present, and annealing the semiconductor substrate in the state in which the silicon nitride film is present after irradiating the charged particle.

In the manufacturing method of the semiconductor device, the lifetime control region is formed on the front surface side of the trench gate in a state in which the silicon nitride film is present. Since the termination of the interface state by hydrogen atoms supplied from the silicon nitride film effectively proceeds particularly during annealing, the interface state can be effectively reduced.

Further, a manufacturing method of a semiconductor device that comprises a semiconductor substrate in which an IGBT region and a diode region are formed, an interlayer insulating film and a front surface electrode that are formed on a front surface of the semiconductor substrate, and a back surface electrode formed on a back surface of the semiconductor substrate is herein provided. The IGBT region comprises a collector layer of a first conductivity type, a first drift layer of a second conductivity type provided on a front surface side of the semiconductor substrate relative to the collector layer, a first body layer of the first conductivity type provided on the front surface side of the semiconductor substrate relative to the first drift layer and partially exposed on the front surface of the semiconductor substrate, an emitter layer of the second conductivity type provided on a front surface of the first body layer and exposed on the front surface of the semiconductor substrate, and a trench gate reaching the first drift layer through the first body layer from the front surface side of the semiconductor substrate. The diode region comprises a cathode layer of the second conductivity type, a second drift layer of the second conductivity type provided on the front surface side of the semiconductor substrate than the cathode layer and having a lower impurity concentration of the second conductivity type than that of the cathode layer, and a second body layer of the first conductivity type provided on the front surface side of the semiconductor substrate relative to the second drift region. The interlayer insulating film insulates the trench gate and the front surface electrode. A lifetime control region which includes a peak of a crystal defect density is formed in the first drift layer and the second drift layer that are located between a depth of a lower end of the trench gate and surfaces of the first drift layer and the second drift layer. The front surface electrode includes an Al based electrode layer and a barrier metal layer. The manufacturing method comprises forming the trench gate on the semiconductor substrate, forming, on the front surface side of the semiconductor substrate, the barrier metal layer provided at least on a portion of the first body layer that is exposed on the front surface of the semiconductor substrate and opened on a front surface side of the trench gate, forming the Al based electrode layer on a further front surface side of the barrier metal layer, irradiating charged particles on a region located between a depth of a lower end of the trench gate and surfaces of the first drift layer and the second drift layer in a state in which the barrier metal layer and the Al based electrode layer are present, and annealing the semiconductor substrate in the state in which the barrier metal layer and the Al based electrode layer are present after irradiating the charged particle.

In the manufacturing method of a semiconductor device, the lifetime control region is formed on the front surface side of the trench gate in a state in which the barrier metal layer and the Al based electrode layer are present on the front surface side of the trench gate. Since the termination of the interface state by hydrogen atoms supplied from the Al based electrode layer effectively proceeds particularly during annealing, the interface state can be effectively reduced. Further, since the barrier metal layer, to which hydrogen atoms are easily adsorbed, is opened on the front surface side of the trench gate, to which hydrogen atoms are supplied, the supply of hydrogen atoms from the Al based electrode layer to the trench gate is not prevented by the barrier metal layer.

DESCRIPTION OF EMBODIMENTS

Embodiment 1

Figure 1:
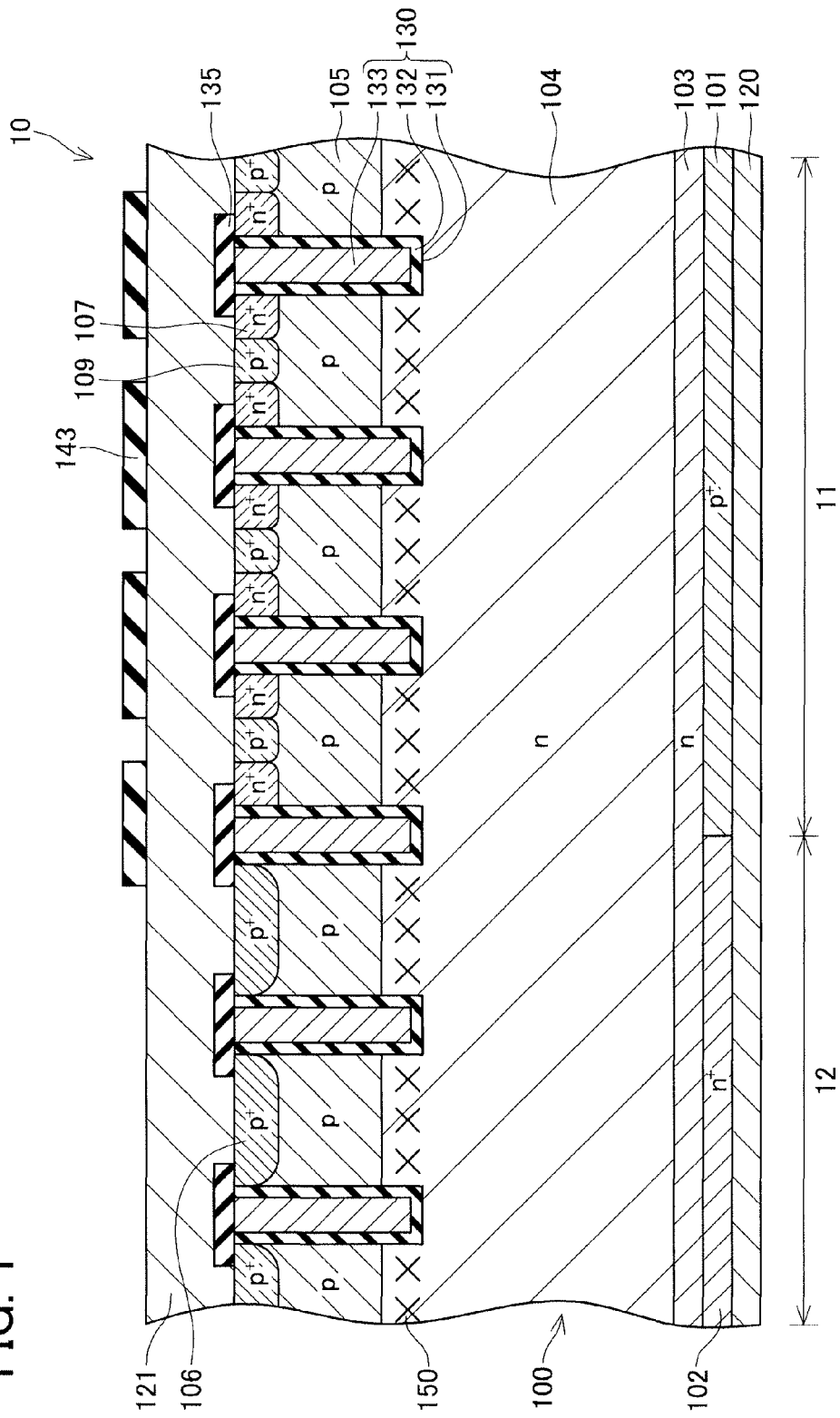
FIG. 1 is a longitudinal sectional view of a semiconductor device according to Embodiment 1.
Figure 2:
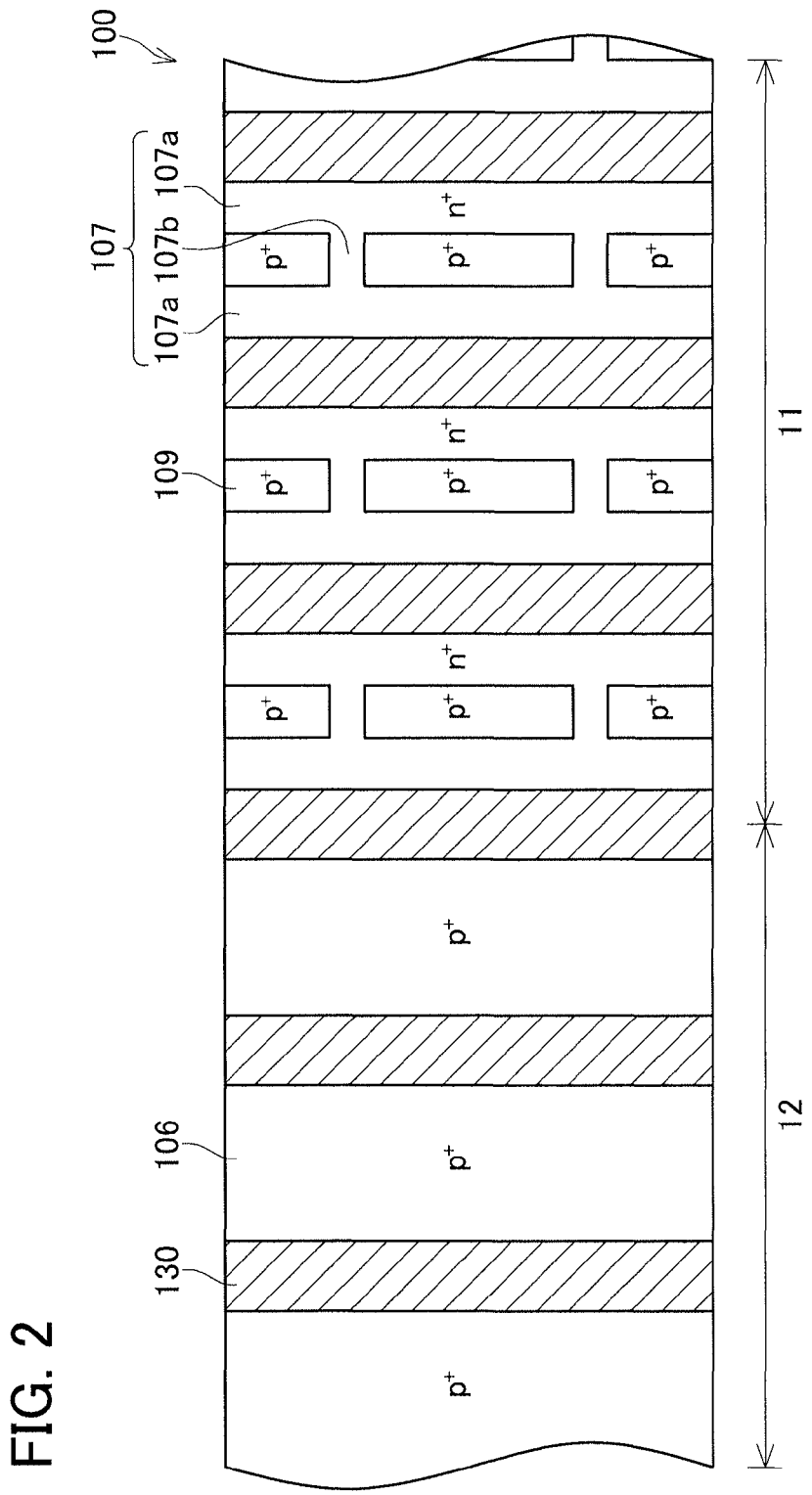
FIG. 2 is a plan view of a semiconductor substrate of the semiconductor device according to Embodiment 1.
Figure 3:
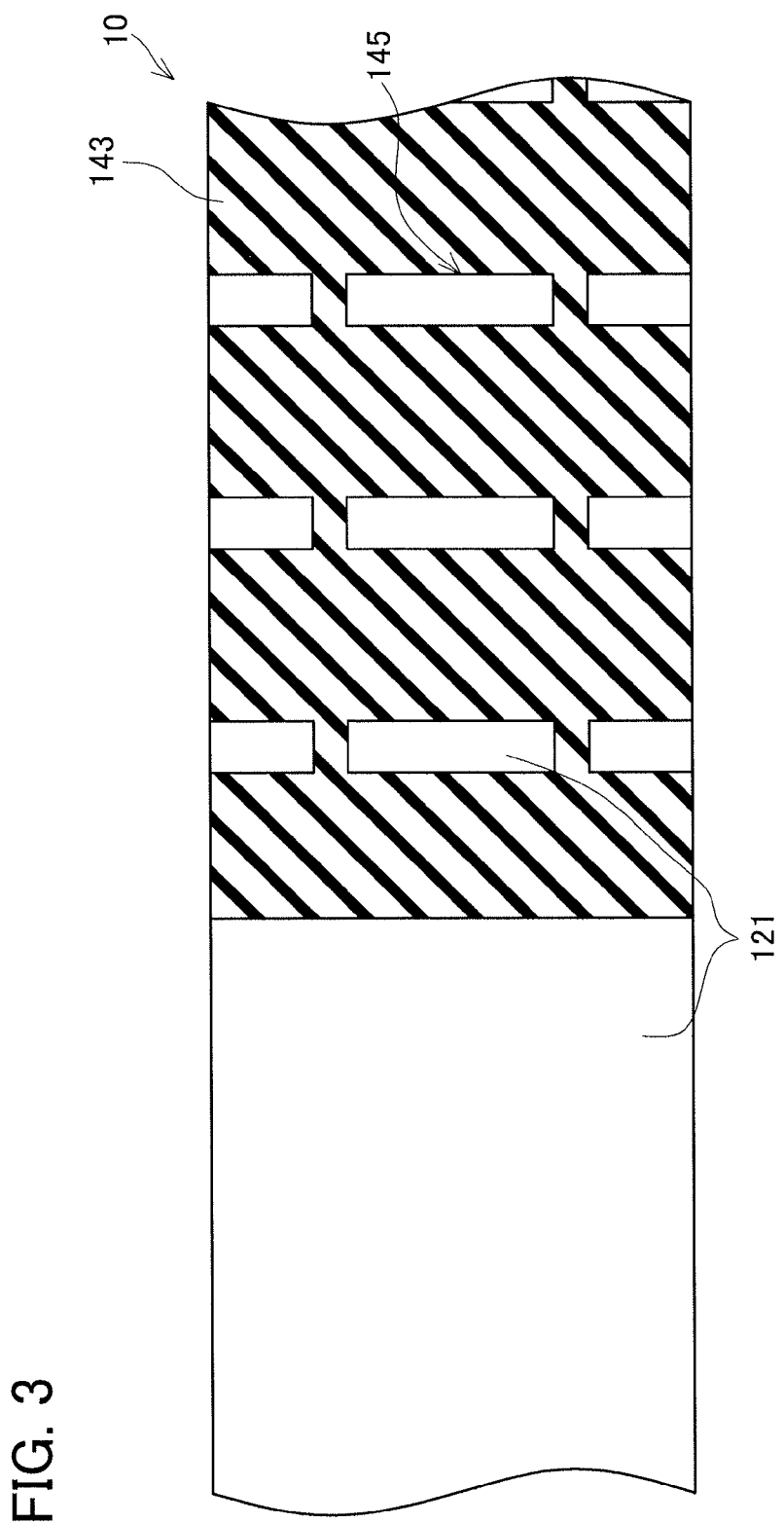
FIG. 3 is a plan view of the semiconductor device according to Embodiment 1.

As shown in FIGS. 1 to 3, a semiconductor device 10 according to the present embodiment includes: a semiconductor substrate 100 in which an IGBT region 11 and a diode region 12 are provided; interlayer insulating films 135, a front surface electrode 121, and a silicon nitride film 143 that are provided on a front surface of the semiconductor substrate 100; and a back surface electrode 120 provided on a back surface of the semiconductor substrate 100. The front surface electrode 121 is a composite electrode layer in which an Al—Si based electrode layer, a Ni based electrode layer, a solder joint layer, and the like are stacked in this order from the semiconductor substrate 100. The back surface electrode 120 is a composite electrode layer in which an Al based electrode layer, a Ti based electrode layer, a Ni based electrode layer, a solder joint layer, and the like are stacked.

The IGBT region 11 includes: a collector layer 101 of a p type; a buffer layer 103 of an n type that is in contact with a front surface of the collector layer 101; a drift layer 104 of the n type that is in contact with a front surface of the buffer layer 103; a body layer 105 of the p type provided on a front surface side of the semiconductor substrate 100 relative to the drift layer 104; body contact layers 109 provided on a front surface of the body layer 105 and exposed on the front surface of the semiconductor substrate 100; emitter layers 107 of the n type provided on the front surface of the body layer 105 and exposed on the front surface of the semiconductor substrate 100; and trench gates 130 reaching the drift layer 104 through the body layer 105 from the front surface side of the semiconductor substrate 100. As shown in FIG. 2, in a plan view of the semiconductor substrate 100, the emitter layers 107 have a ladder shape extending along a longitudinal direction of the trench gates 130, and each body contact layer 109 is adjacent to the emitter layers 107 in such a way as to be fitted in spaces in the ladder shape of the emitter layers 107. Each emitter layer 107 has portions 107a extending along the corresponding trench gate 130 and portions 107b extending along a short direction (i.e., a direction orthogonal to the longitudinal direction) of the trench gate 130. Each portion 107b is located between two trench gates 130 adjacent to the portion 107b in the short direction and connects two portions 107a extending along the respective trench gates 130, and the body contact layer 109 is disposed in regions surrounded by these portions 107a and 107b. It should be noted that FIG. 2 illustrates the front surface of the semiconductor substrate 100 and omits to illustrate the interlayer insulating films 135, the front surface electrode 121, and the silicon nitride film 143, which are provided on the front surface. Each trench gate 130 includes: a trench 131 provided in the semiconductor substrate 100; a gate insulating film 132 provided on an inner wall of corresponding trench 131; and a gate electrode 133 filling the trench 131 while being covered with the gate insulating film 132. Each interlayer insulating film 135 covers a front surface of the trench gate 130 and a portion of the emitter layer 107 that is close to the trench gate 130, thus insulating the gate electrode 133 from the front surface electrode 121. The front surface electrode 121 is in contact with portions of the emitter layers 107 and the body contact layers 109 that are exposed on the front surface of the semiconductor substrate 100. As shown in FIGS. 1 and 3, the silicon nitride film 143 is provided in a portion of a front surface of the front surface electrode 121 that is located within the IGBT region 11. The silicon nitride film 143 is provided above the trench gate 130 and above the emitter layer 107 (note here that the term "above" here means a position on the front surface side of the semiconductor substrate 100 along a thickness direction of the semiconductor substrate 100 and, in FIG. 1, means "vertically above"), and is not provided above the body contact layer 109. The silicon nitride film 143 includes openings 145 opened above the body contact layers 109. The front surface electrode 121 is exposed through the openings 145.

The diode region 12 includes: a cathode layer 102 of the n type; a buffer layer 103 of the n type that is in contact with a front surface of the cathode layer 102; a drift layer 104 of the n type that is in contact with a front surface of the buffer layer 103; a body layer 105 of the p type provided on the front surface side of the semiconductor substrate 100 relative to the drift layer 104; and anode layers 106 provided on a front surface of the body layer 105 and exposed on the front surface of the semiconductor substrate 100. As shown in FIG. 2, the anode layers 106 are provided on the front surface of the semiconductor substrate 100 in such a way as to occupy spaces between trench gates adjacent to the anode layers 106 in a longitudinal direction. As with the IGBT region 11, the diode region 12 includes trench gates 130 reaching the drift layer 104 through the body layer 105 from the front surface side of the semiconductor substrate 100. In the diode region 12, as shown in FIGS. 1 to 3, the silicon nitride film 143 is provided only in a portion of the anode layer 106 that is closest to the IGBT region 11 and whose front surface is covered with the interlayer insulating film 135. The front surface electrode 121 is in contact with a portion of the anode layer 106 that is exposed on the front surface of the semiconductor substrate 100. It should be noted that an n-type impurity concentration of the drift layer 104 is lower than an n-type impurity concentration of the cathode layer 102. It is preferable that the n-type impurity concentration of the drift layer 104 be lower than $1 \times 10^{14}$ atoms/cm$^3$.

The buffer layer 103 is provided as one buffer layer 103 across both the IGBT region 11 and the diode region 12. The drift layer 104 is provided as one drift layer 104 across both the IGBT region 11 and the diode region 12. The body layer 105 is provided as one body layer 105 across both the IGBT region 11 and the diode region 12. Portions of the buffer layer 103 and the drift layer 104 that are included in the IGBT region 11 are both examples of the first drift layer, and portions of the buffer layer 103 and the drift layer 104 that are included in the diode region 12 are both examples of the second drift layer. A portion of the body layer 105 that is included in the IGBT region and the body contact layers 109 are both examples of the first body layer. A portion of the body layer 105 that is included in the diode region 12 and the anode layers 106 are both examples of the second body layer.

A lifetime control region 150 is provided in the drift layer 104 across the IGBT region 11 and the diode region 12. The lifetime control region 150 is a region that has a higher crystal defect density than an area therearound. The lifetime control region 150 includes a peak of a crystal defect density. That is, the lifetime control region 150 is a region in which, when a crystal defect density distribution in a depth direction in the drift region 104 is measured, the local maximum value (preferably the maximum value) of the crystal defect density distribution is present. The lifetime control region 150 is provided in a portion of the drift layer 104 that is located between a depth of a lower end of the trench gates 130 and a boundary between the drift layer 104 and the body layer 105 (i.e., a portion of the drift layer 104 that is present at a position shallower than the depth of the lower end of the trench gates 130). That is, an average value of crystal defect densities in the portion of the drift layer 104 located at the position shallower than the depth of the lower end of the trench gates 130 is higher than an average value of crystal defect densities in a portion of the drift layer 104 located at a position deeper than the depth of the lower end of the trench gates 130. In the lifetime control region 150, the lifetime of carriers is effectively decreased. This allows the diode region 12 to exhibit favorable reverse recovery characteristics. In the semiconductor device 10, the diode region 12 particularly effectively exhibits favorable reverse recovery characteristics, as the lifetime control region 150 is provided in a portion of the drift layer 104 that is close to the boundary between the body layer 105 and the drift layer 104. Further, in the semiconductor device 10, an interface state is easily formed between the gate insulating film 132 of each trench gate 130 and a portion of the semiconductor substrate 100 that is in contact with each gate insulating film 132, as there is a partial overlap between a depth at which each trench gate 130 is provided and a depth at which the lifetime control region 150 is provided. In general, the formation of such an interface state destabilizes a threshold voltage of a gate of an IGBT, thus increasing variations in the threshold voltage of mass-produced IGBTs. However, as will be described in detail below, at the time of manufacturing of the semiconductor device 10, the interface state is terminated and reduced by hydrogen atoms supplied from the silicon nitride films 143. This reduces the variations in the threshold voltage of the trench gates 130. The semiconductor device 10 makes it possible to both reduce the variations in the threshold voltage of the trench gates 130 and improve the reverse recovery characteristics of the diode region 12.

The following will describe an example of a manufacturing method of a semiconductor device 10. It should be noted that the following will omit a detailed description of steps in which a conventional publicly-known manufacturing method of a semiconductor device can be utilized.

Figure 4:
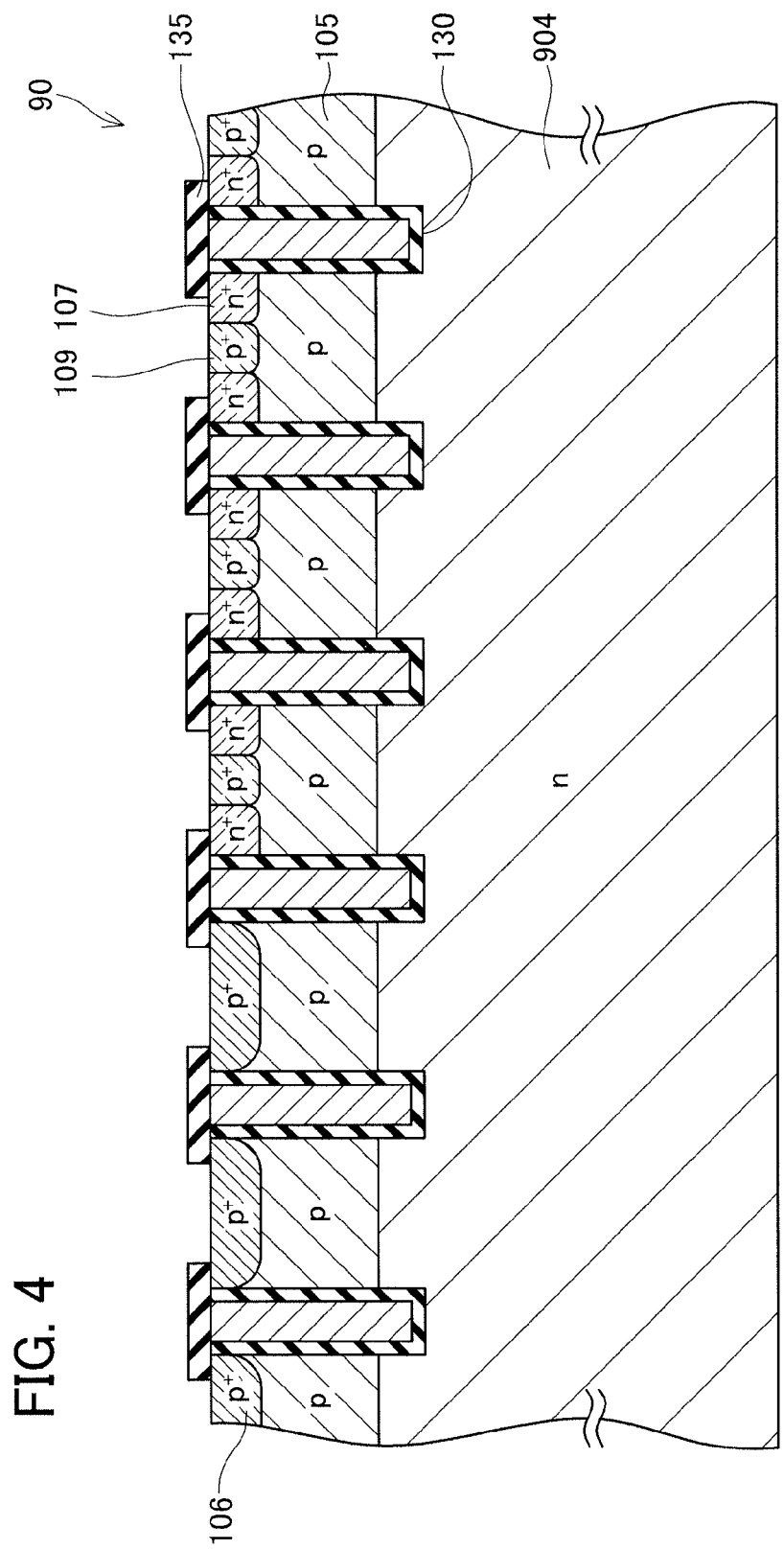
FIG. 4 is a diagram explaining a manufacturing method of the semiconductor device according to Embodiment 1.

First, as shown in FIG. 4, a raw material wafer 90 is prepared. For example, a body layer 105, anode layers 106, emitter layers 107, and body contact layers 109 are formed on a front surface side of an n-type silicon wafer by using conventional publicly-known methods such as ion implantation and annealing An n layer 904 is a portion of the n-type silicon wafer into which no ions have been implanted, and is a layer that is to serve as a drift layer 104 of the semiconductor device 10. After that, trench gates 130 and interlayer insulating films 135 are formed by using conventional publicly-known methods such as etching, thermal oxidation, and CVD. This makes it possible to manufacture the raw material wafer 90 shown in FIG. 4. It should be noted that in the thermal oxidation step of forming the gate insulating film 132, the pyrogenic oxidization method, in which water vapor is used as an oxidizing species, can be suitably used. Because of this, when formed by using the pyrogenic oxidization method, the gate insulating film can contain a large amount of water.

Figure 5:
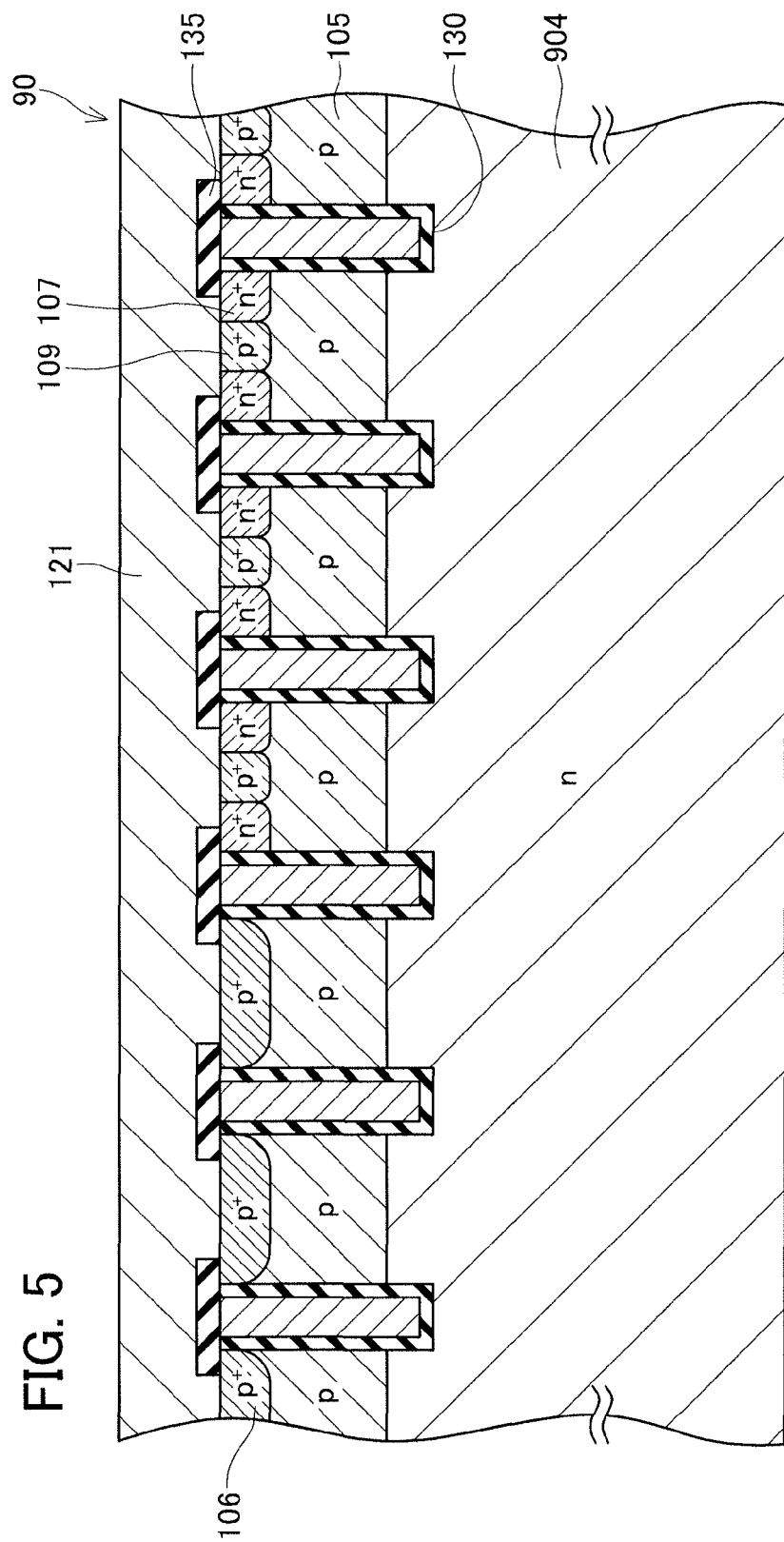
FIG. 5 is a diagram explaining the manufacturing method of the semiconductor device according to Embodiment 1.
Figure 6:
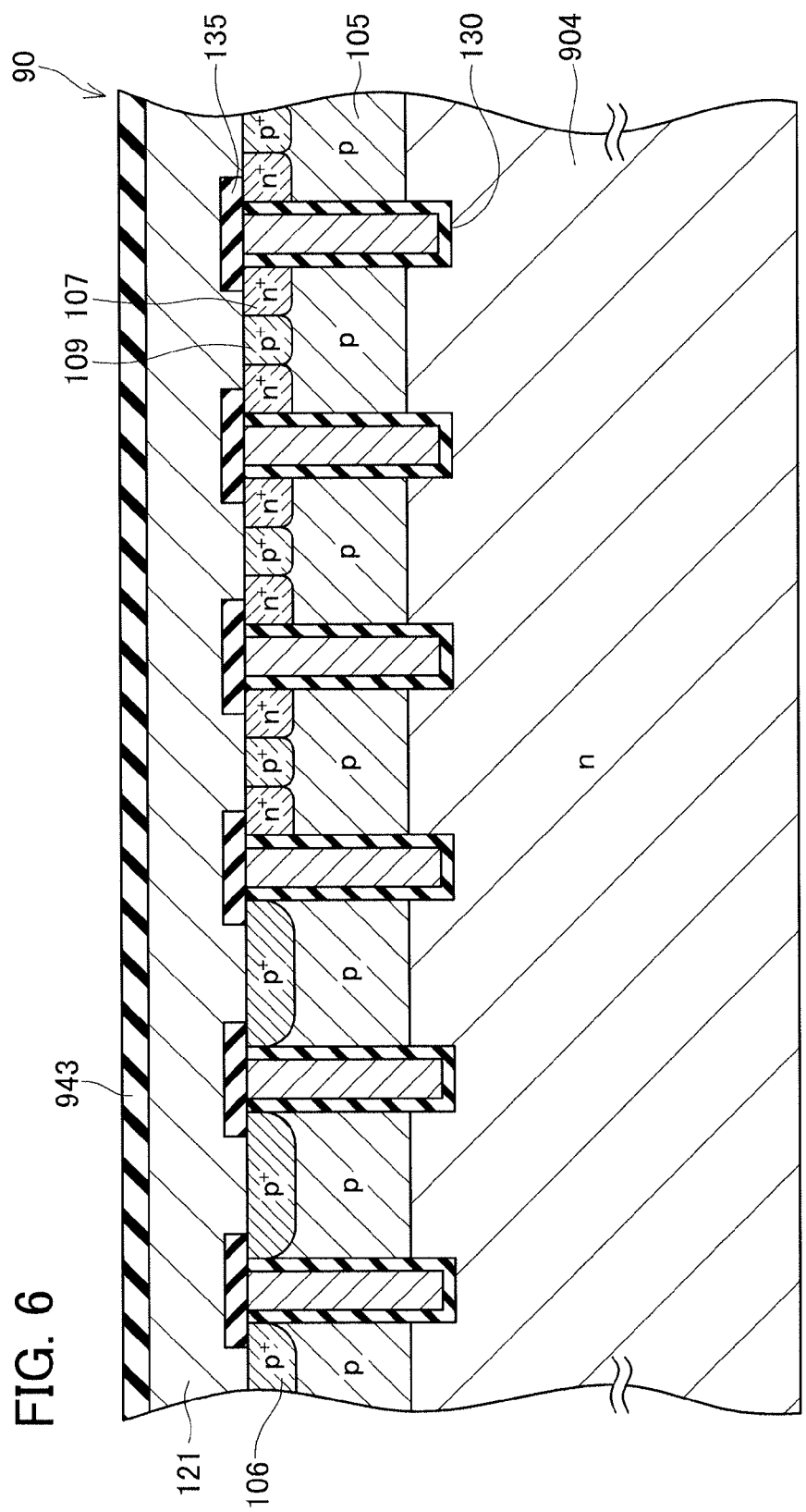
FIG. 6 is a diagram explaining the manufacturing method of the semiconductor device according to Embodiment 1.

Next, as shown in FIG. 5, a front surface electrode 121 is formed on a front surface of the raw material wafer 90. The front surface electrode 121 is formed in such a thickness as to further cover a front surface of the interlayer insulating films 135 formed on a front surface of the trench gates 130. Next, as shown in FIG. 6, a silicon nitride film 943 is formed on a front surface of the front surface electrode 121 by using a conventional publicly-known film forming method such as CVD. The silicon nitride film 943 is formed to such an extent as to entirely cover the front surface electrode 121.

Figure 7:
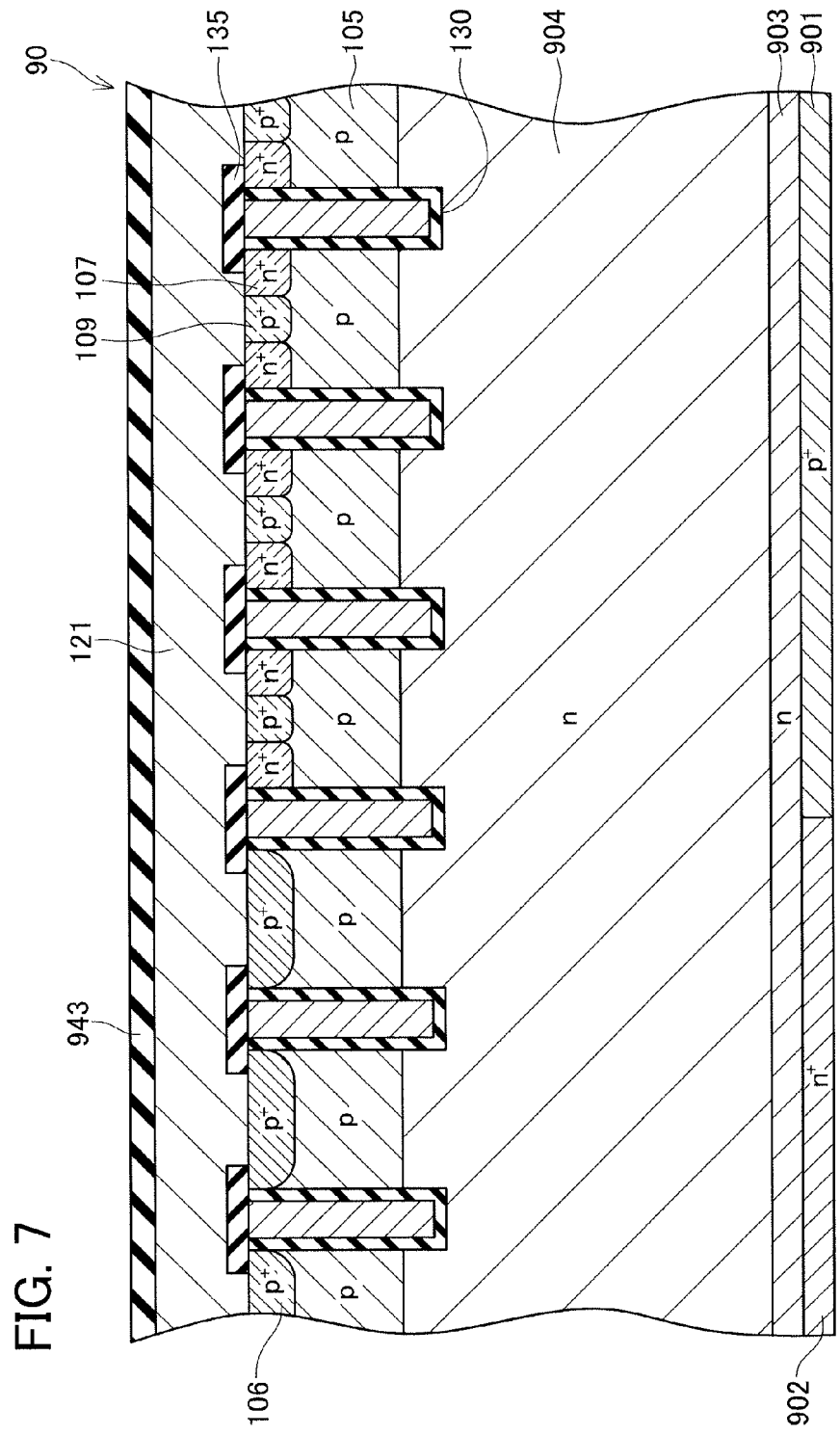
FIG. 7 is a diagram explaining the manufacturing method of the semiconductor device according to Embodiment 1.

Next, as shown in FIG. 7, after the thickness of the raw material wafer 90 is thinned by cutting a back surface of the raw material wafer 90, ion implantation is performed on the back surface of the raw material wafer 90, whereby an ion-implanted layer 901 of a p type, an ion-implanted layer 902 of an n type, and an ion-implanted layer 903 of the n type are formed on a back surface side of the raw material wafer 90.

Figure 8:
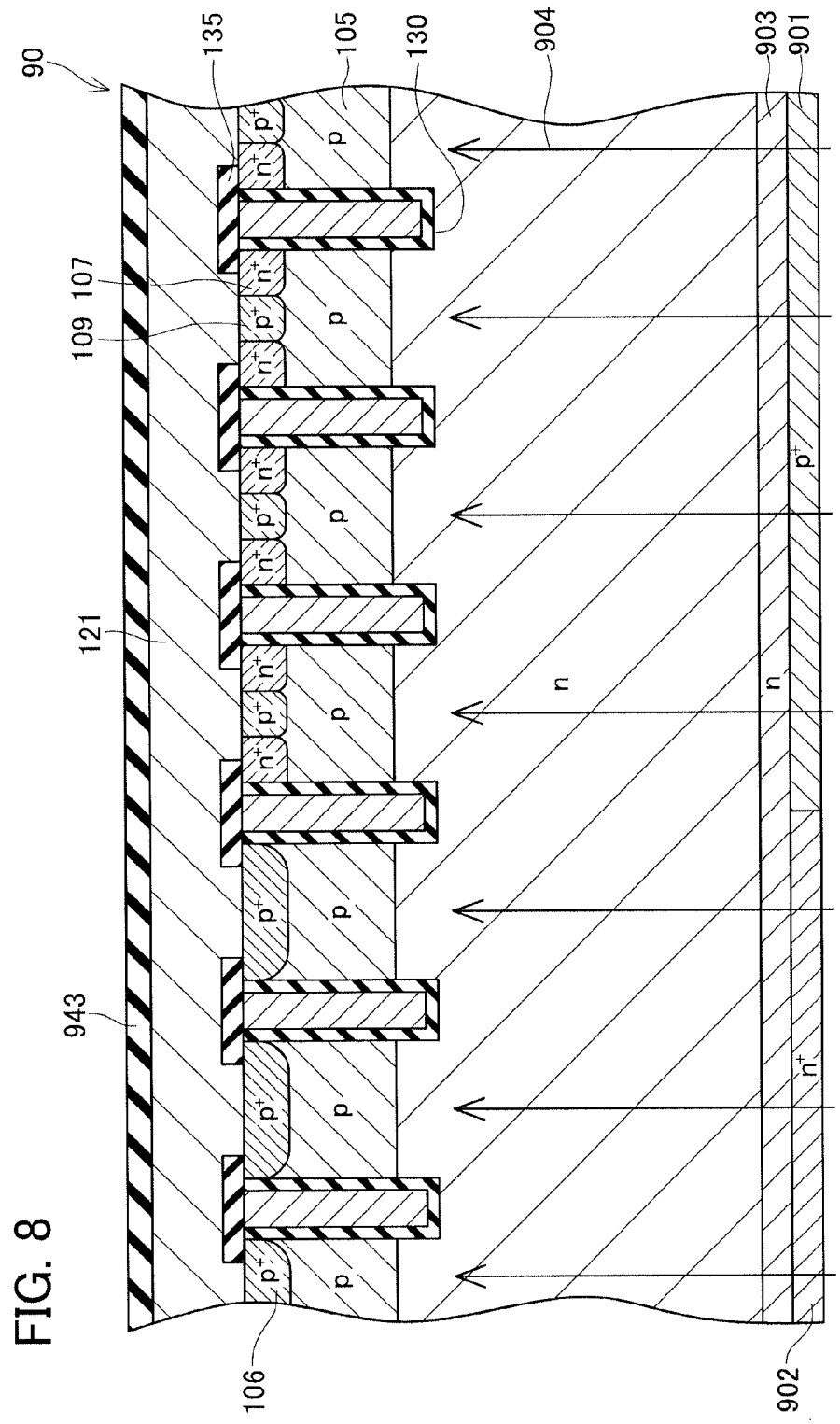
FIG. 8 is a diagram explaining the manufacturing method of the semiconductor device according to Embodiment 1.

Next, as shown in FIG. 8, crystal defects are formed by irradiating the inner part of the drift layer 104 with charged particles from the back surface side of the raw material wafer 90 in a state in which the silicon nitride film 943 is present on the front surface of the front surface electrode 121. A position of irradiation with charged particles is adjusted so that a peak of a crystal defect density is included in a region located between a depth of lower ends of the trench gates 130 and a boundary between the drift layer 104 and the body layer 105. Such irradiation with charged particles causes some of the charged particles to be implanted into the gate insulating films 132. For this reason, performing ion implantation makes it easy for an interface state to be formed between the gate insulating films 132 and portions of the semiconductor substrate 100 that are in contact with the gate insulating films 132. Alternatively, crystal defects may be formed by irradiating the inner part of the drift layer with charged particles having passed through the trench gate from the front surface side.

Figure 9:
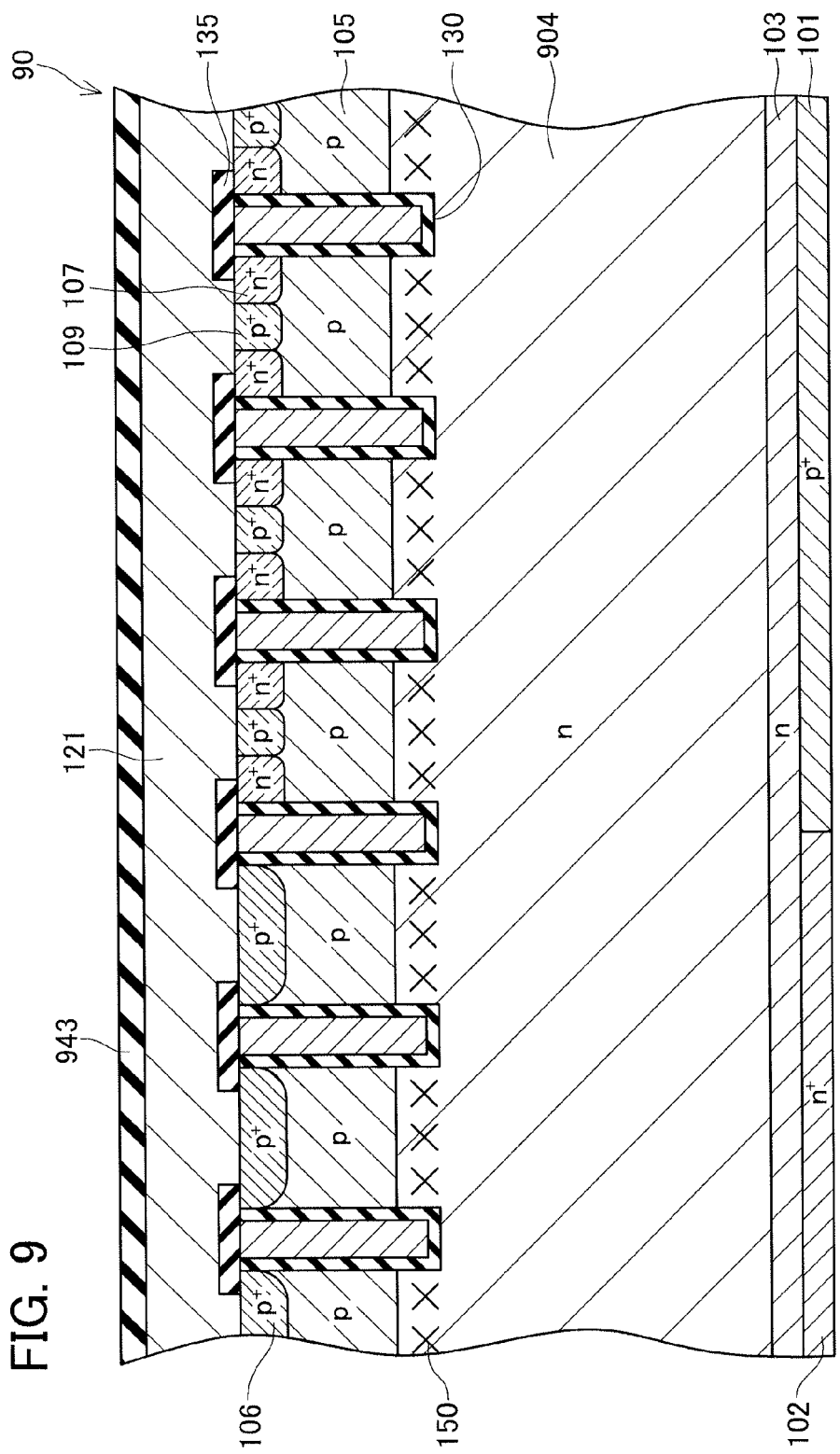
FIG. 9 is a diagram explaining the manufacturing method of the semiconductor device according to Embodiment 1.

Next, as shown in FIG. 9, a lifetime control region 150 is formed by performing annealing for stabilizing the crystal defects in a state in which the silicon nitride film 934 is present on the front surface of the front surface electrode 121. In this annealing step, the ion-implanted layer 901 of the p type, the ion-implanted layer 902 of the n type, and the ion-implanted layer 903 of the n type are also annealed to form a collector layer 101 of the p type, a cathode layer 102 of the n type, and a buffer layer 103 of the n type, respectively. Further, by thus performing the annealing step in a state in which the silicon nitride film 943 is present, hydrogen atoms are supplied from the silicon nitride film 943 into the semiconductor substrate 100. Hydrogen atoms thus supplied allows the termination of the interface state present at the boundary between the gate insulating films 132 and the semiconductor substrate 100 to effectively proceed, thus making it possible to effectively reduce the interface state. It should be noted that in the case of the gate insulating films 132 formed by using the pyrogenic oxidization method, the interface state is also terminated by hydrogen atoms supplied from the gate insulating films 132 containing a large amount of water, so that the interface state can be more effectively reduced.

Figure 10:
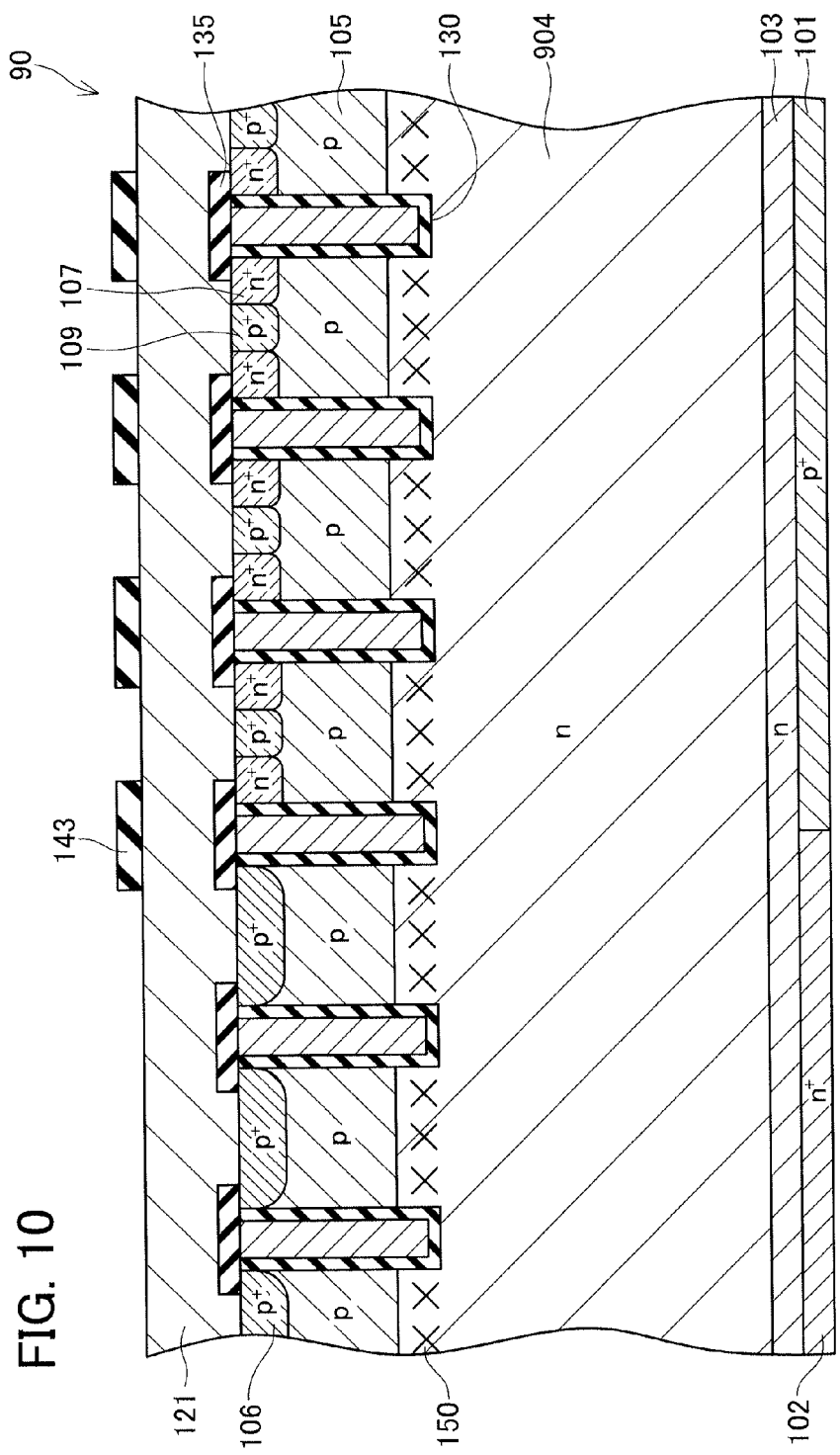
FIG. 10 is a diagram explaining the manufacturing method of the semiconductor device according to Embodiment 1.

Next, as shown in FIG. 10, the silicon nitride film 943 is partially removed by a conventional publicly-known method such as etching Portions of the silicon nitride film 943 that are formed above the anode layers 106 and above the body contact layers 109 are removed so that the silicon nitride film 943 forms a silicon nitride film 143 patterned in the same shape as that shown in FIG. 1. Furthermore, by forming a back surface electrode 120 on the back surface of the raw material wafer 90 shown in FIG. 10, the semiconductor device 10 shown in FIGS. 1 to 3 can be manufactured.

(Modification)

Figure 11:
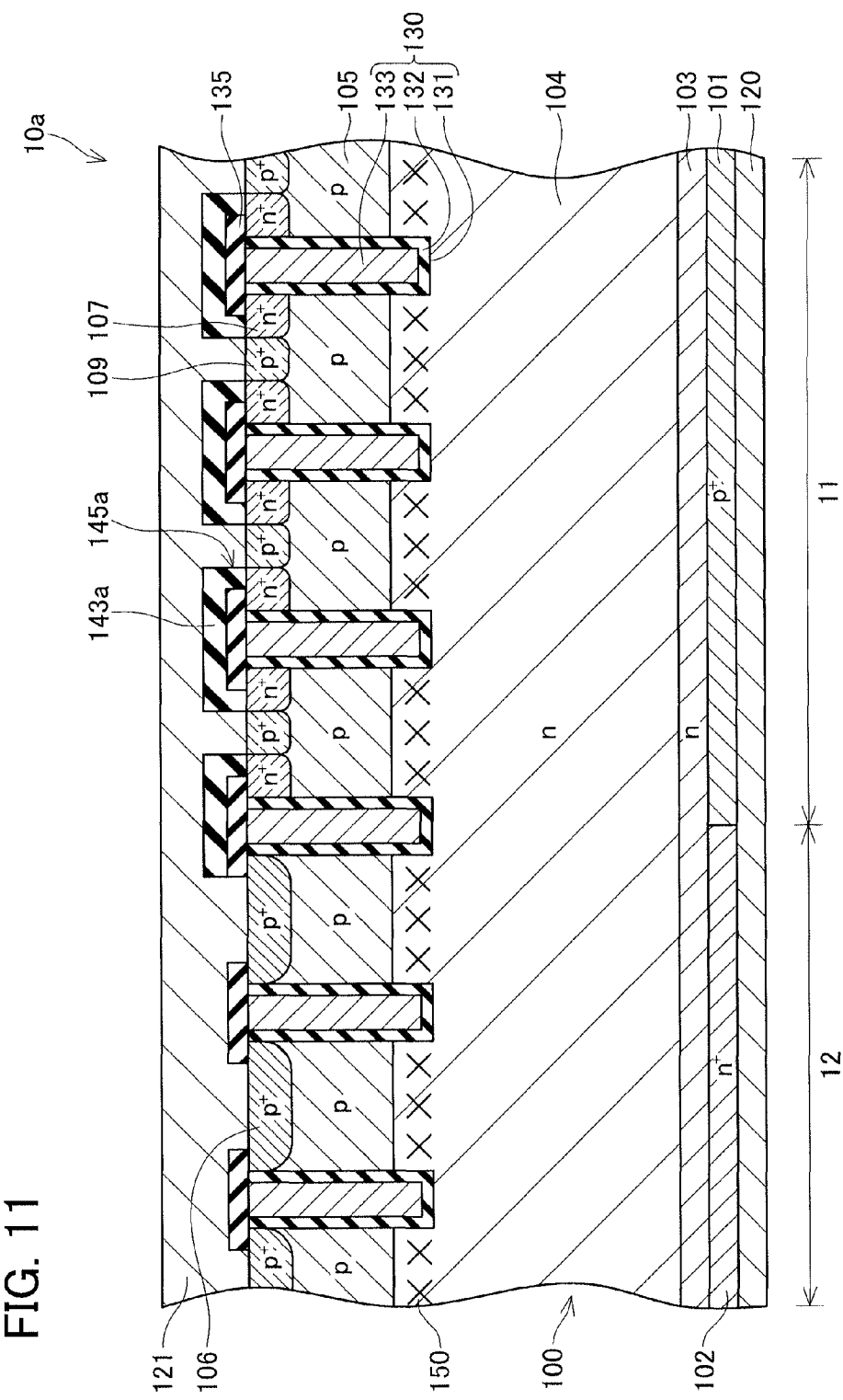
FIG. 11 is a longitudinal sectional view of a semiconductor device according to a modification.

In Embodiment 1, the manufacturing method has been described in which the silicon nitride film 943 is partially removed after annealing for stabilizing crystal defects has been performed. However, even when the silicon nitride film 943 is entirely removed, the effect of reduction of the interface state by hydrogen atoms supplied from the silicon nitride film 943 can be brought about. In this case, a semiconductor device is manufactured that has a configuration in which the silicon nitride film 143 has been removed from the semiconductor device 10 shown in FIGS. 1 to 3. Further, although Embodiment 1 has been described by taking, as an example, a case where the front surface electrode 121 is a composite electrode including no barrier metal layer, the present disclosure is not limited to this example. The front surface electrode 121 may be replaced by a composite electrode layer including a barrier metal layer entirely or partially formed on a boundary surface between the composite layer and the semiconductor substrate 100. Also in a case where a barrier metal layer to which hydrogen atoms are easily adsorbed, is used, the variations in the threshold voltage of the trench gates can be reduced, as hydrogen atoms are supplied and supplemented from the silicon nitride film Further, a silicon nitride film only needs to be provided above the trench gates 130 and above the emitter layers 107, and does not need to be provided above the front surface electrode 121. The advantageous effects of the present disclosure can be obtained even when the silicon nitride film is disposed below and/or inside the front surface electrode 121. For example, as in a case of a semiconductor device 10a shown in FIG. 11, the silicon nitride film 143a may be disposed below the front surface electrode 121. The silicon nitride film 143a is provided above the trench gates 130 and above the emitter layers 107 at below the front surface electrode 121, and is not provided above the body contact layers 109. The silicon nitride film 143a covers front and side surfaces of the interlayer insulating films 135 provided in the IGBT region 11, and covers portions of front surfaces of the emitter layers 107 that are not covered with the interlayer insulating films 135. In the IGBT region 11, the silicon nitride film 143a is not provided on front surfaces of the body contact layers 109, and has openings 145a opened on front surface sides of the body contact layers 109. In the diode region 12, the silicon nitride film 143a is provided only in a portion of the anode layer 106 that is closest to the IGBT region 11 and whose front surface is covered with the interlayer insulating film 135. The front surface electrode 121 further covers a front surface of the silicon nitride film 143a, and is in contact with the front surfaces of the body contact layers 109 through the openings 145a of the silicon nitride film 143a. Further, the front surface electrode 121 is in contact with portions of the anode layers 106 that are exposed on the front surface of the semiconductor substrate 100. The back surface electrode 120 is in contact with the collector layer 101.

Embodiment 2

Figure 12:
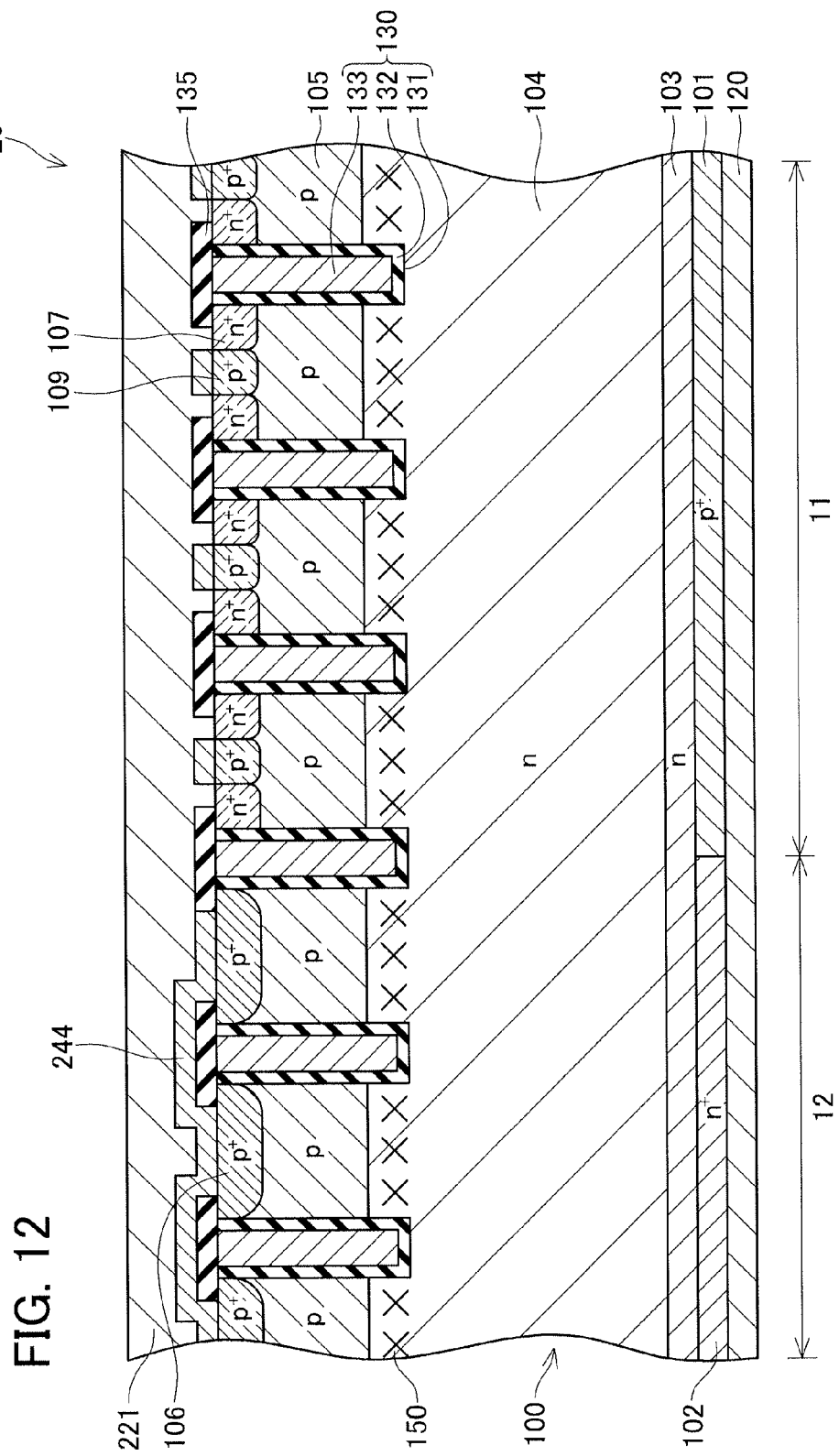
FIG. 12 is a longitudinal sectional view of a semiconductor device according to Embodiment 2.

A semiconductor device 20 shown in FIG. 12 differs from the semiconductor device 10 in that no silicon nitride film 143 is provided on the front surface of the semiconductor substrate 100 or on the front surface of the interlayer insulating films 135 and that a front surface electrode includes an Al based electrode layer 221 and a barrier metal layer 244. Although not illustrated, a Ni based electrode layer and a solder joint layer are further stacked on a front surface of the Al based electrode layer as a part of the front surface electrode.

The Al based electrode layer 221 is made of an electrode material composed mainly of aluminum, such as Al or an Al—Si alloy, which is commonly used in the field of semiconductors, and these electrode materials are known to be highly capable of supplying hydrogen atoms.

The barrier metal layer 244 is provided at such a position in the diode region 12 as to cover the front surfaces of the semiconductor substrate 100 and the front surfaces of the interlayer insulating films 135. The barrier metal layer 244 is provided at such a position in the IGBT region 11 as to cover the front surface of the body contact layer 109, and is not provided at such a position in the IGBT region 11 as to cover the front surfaces of the emitter layers 107 and the front surfaces of the interlayer insulating films 135. That is, the barrier metal layer 244 is provided between a portion of the first body layer (a portion of the body layer 105 that is located within the diode region 12) that is exposed on the front surface of the semiconductor substrate 100 and the Al based electrode layer 221, and is not provided between the trench gates 130 and the Al based electrode layer 221 in the IGBT region 11. The barrier metal layer 244 can be made of a conventional publicly-known material that is used as a barrier metal, such as titanium (Ti), titanium nitride (TiN), or titanium tungsten (TiW). The other components are the same as those of the semiconductor device 10, and as such, are not described here.

In the semiconductor device 20 according to Embodiment 2, too, the lifetime control region 150 is provided near the lower end of the trench gates 130. However, as will be described in detail below, in the process of manufacturing the semiconductor device 20, hydrogen atoms are supplied from the Al based electrode layer 221 to terminate and reduce the interface state present at the boundary between the gate insulating films 132 and the semiconductor substrate 100. This reduces the variations in the threshold voltage of the trench gates 130.

Further, in the IGBT region 11, the barrier metal layer 244, to which hydrogen atoms are easily adsorbed, is provided between portions of the body contact layers 109 that are exposed on the front surface of the semiconductor substrate 100 and the Al based electrode layer 221, and is not provided between the trench gates 130 and the Al based electrode layer 221. That is, the barrier metal layer 244 is provided only at positions comparatively away from the trench gates 130, to which hydrogen atoms are supplied, provided in the IGBT region 11. For this reason, in the IGBT region 11, the supply of hydrogen atoms from the Al based electrode layer 221 to the trench gate 130 is not prevented by the barrier metal layer 244.

The semiconductor device 20 makes it possible to supply hydrogen atoms to the trench gate 130 provided in the IGBT region 11 while ensuring effects (such as the prevention of an Al spike) that are brought about by providing the barrier metal layer 244, thus making it possible to reduce the variations in the threshold voltage of the trench gates 130 during operation of the IGBT region 11.

The following will describe an example of a manufacturing method of the semiconductor device 20. It should be noted that the following will omit a detailed description of steps in which a conventional publicly-known manufacturing method of a semiconductor device can be utilized.

Figure 13:
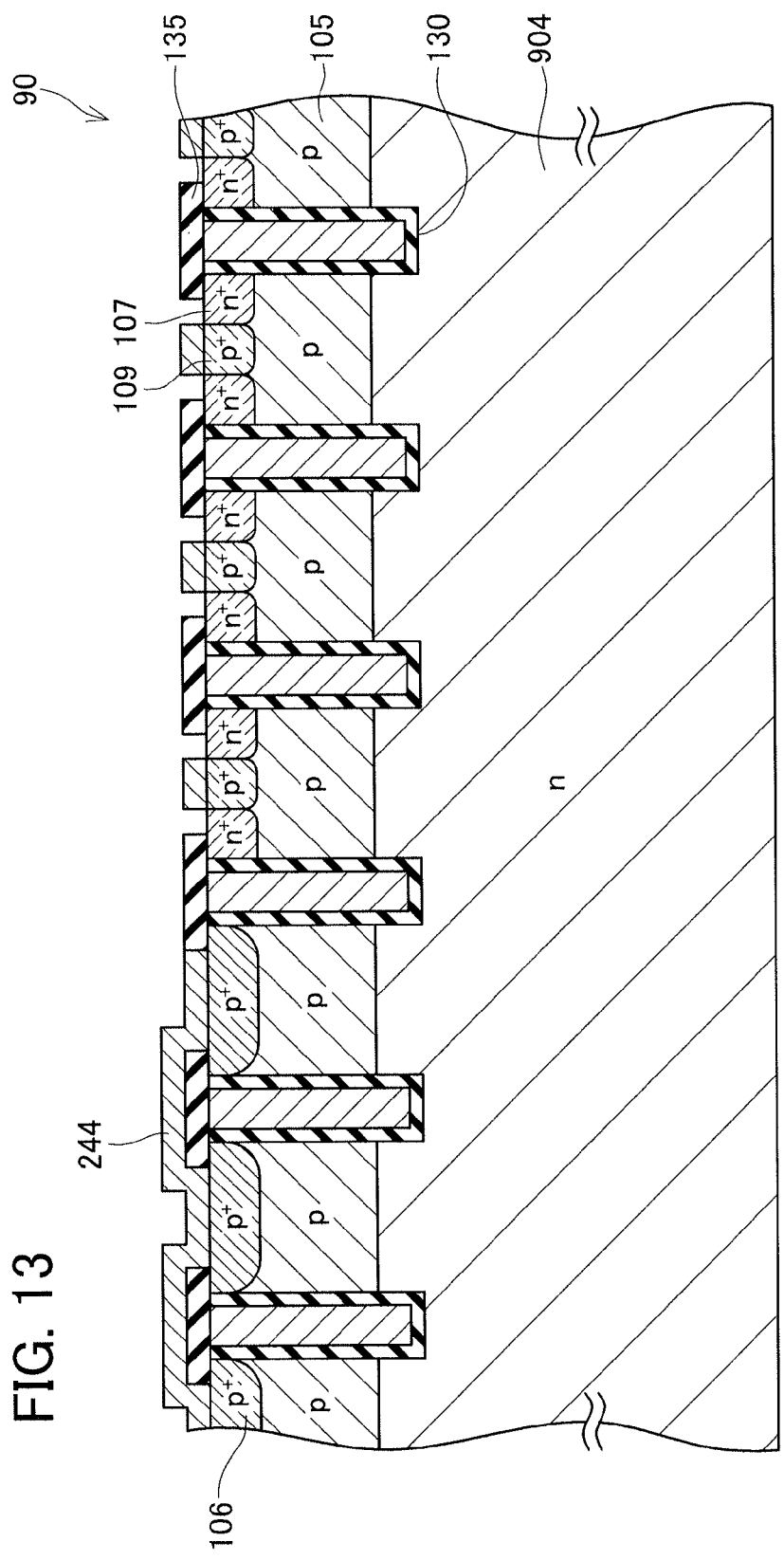
FIG. 13 is a diagram explaining a manufacturing method of the semiconductor device according to Embodiment 2.

First, the raw material wafer 90 shown in FIG. 4 is prepared by using the same methods as those used in Embodiment 1. As shown in FIG. 13, a barrier metal layer 244 is formed by sputtering or the like on the raw material wafer 90. The barrier metal layer 244 is patterned to be in contact with the front surface of the anode layers 106 and the front surface of the body contact layers 109 and opened on the front surface side of the trench gates 130.

Figure 14:
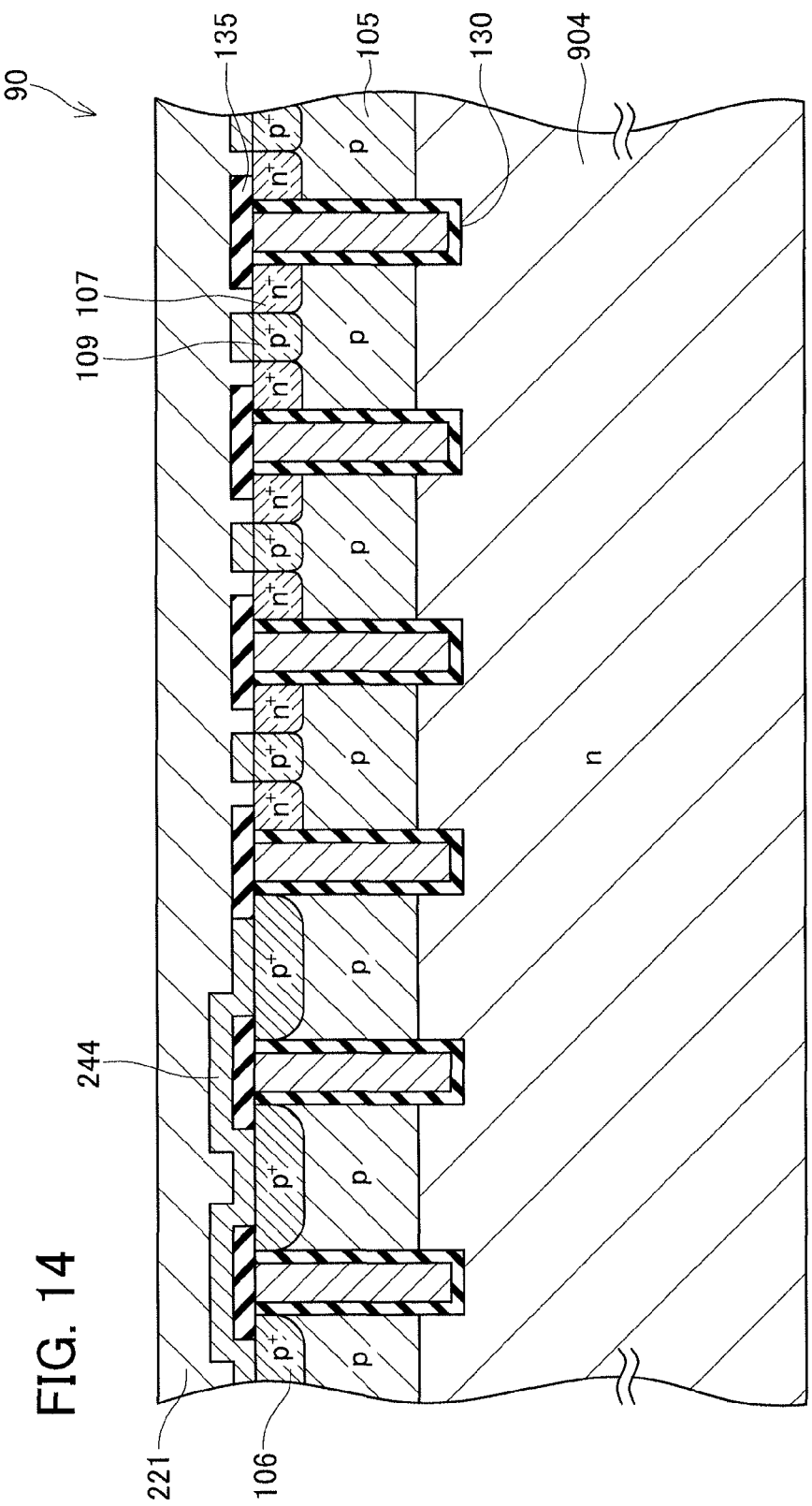
FIG. 14 is a diagram explaining the manufacturing method of the semiconductor device according to Embodiment 2.

Next, as shown in FIG. 14, an Al based electrode layer 221 is further formed by sputtering or the like on a front surface of the barrier metal layer 244.

Figure 15:
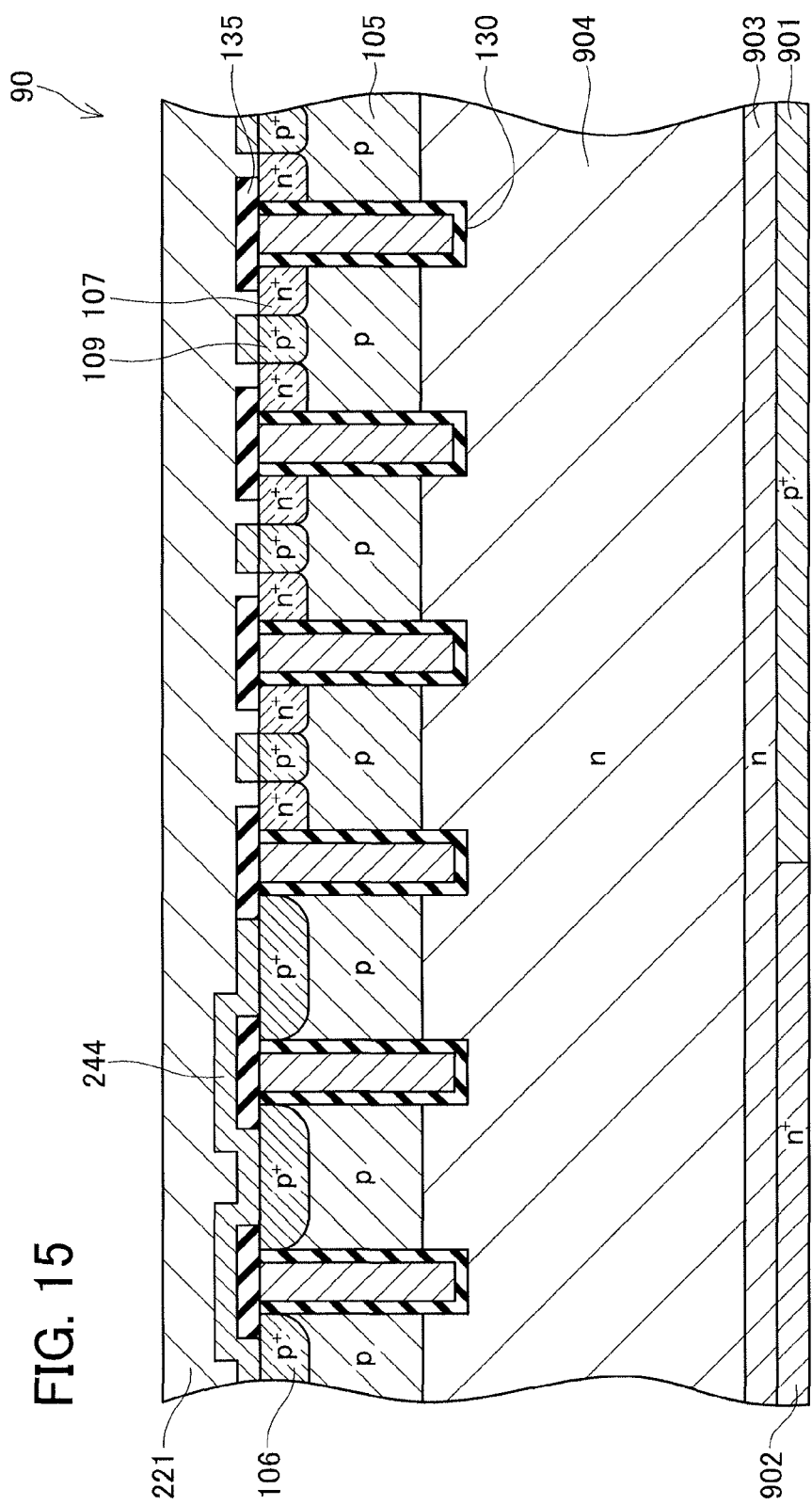
FIG. 15 is a diagram explaining the manufacturing method of the semiconductor device according to Embodiment 2.

Next, as shown in FIG. 15, after the thickness of the raw material wafer 90 is thinned by cutting a back surface of the raw material wafer 90, ion implantation is performed on the back surface of the raw material wafer 90, whereby the ion-implanted layer 901 of a p type, the ion-implanted layer 902 of an n type, and the ion-implanted layer 903 of the n type are formed on a back surface side of the raw material wafer 90.

Figure 16:
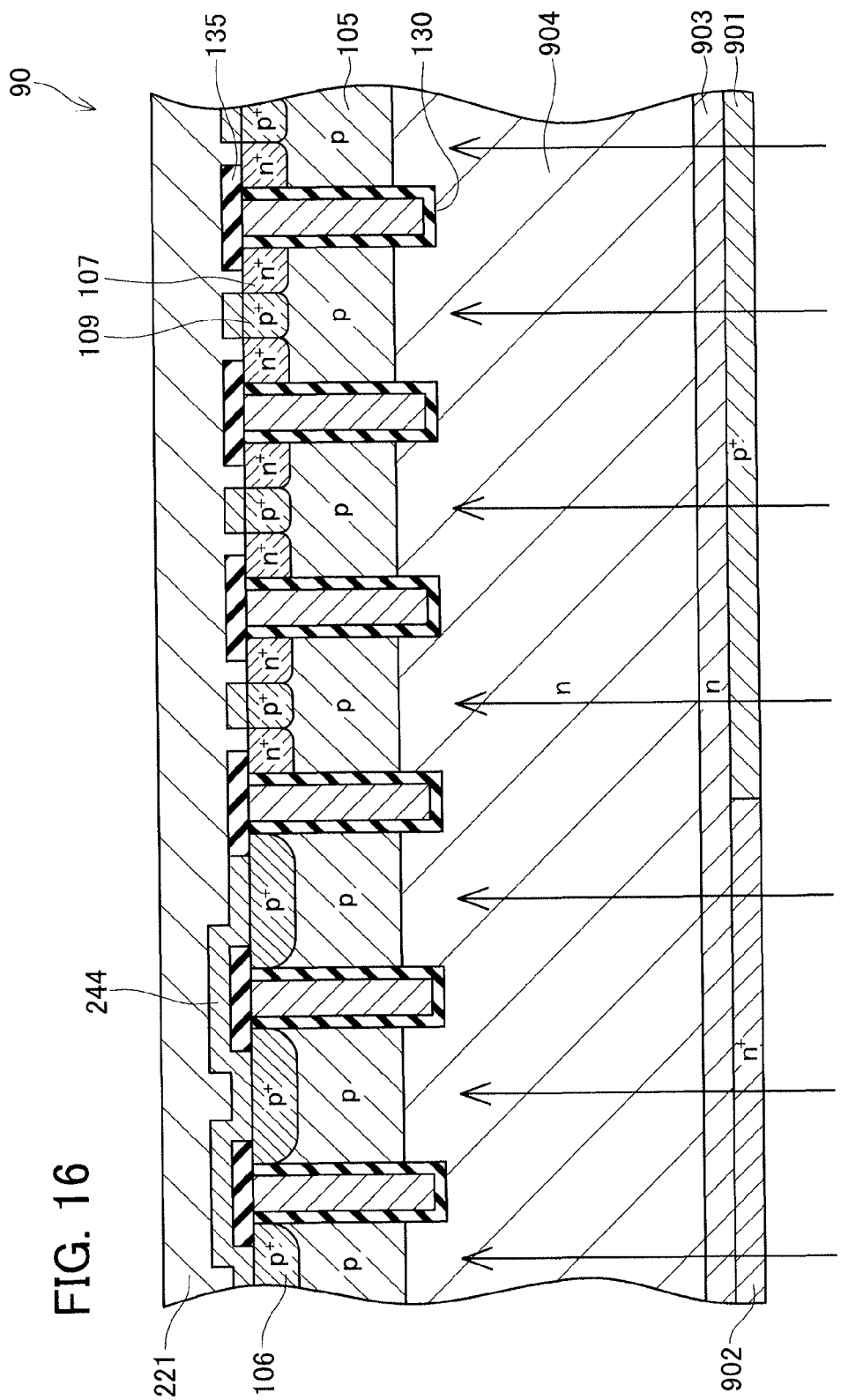
FIG. 16 is a diagram explaining the manufacturing method of the semiconductor device according to Embodiment 2.

Next, as shown in FIG. 16, crystal defects are formed by irradiating the inner part of the drift layer 104 with charged particles from the back surface side of the raw material wafer 90 in a state in which the barrier metal layer 244 and the Al based electrode layer 221 are present on the front surface of the raw material wafer 90. The position of irradiation with charged particles is adjusted so that a peak of a crystal defect density is included in a region located between a depth of lower ends of the trench gates 130 and a boundary between the drift layer 104 and the body layer 105. Such irradiation with charged particles causes some of the charged particles to be implanted into the gate insulating films 132. For this reason, performing ion implantation makes it easy for an interface state to be formed between the gate insulating films 132 and portions of the semiconductor substrate 100 that are in contact with the gate insulating films 132.

Figure 17:
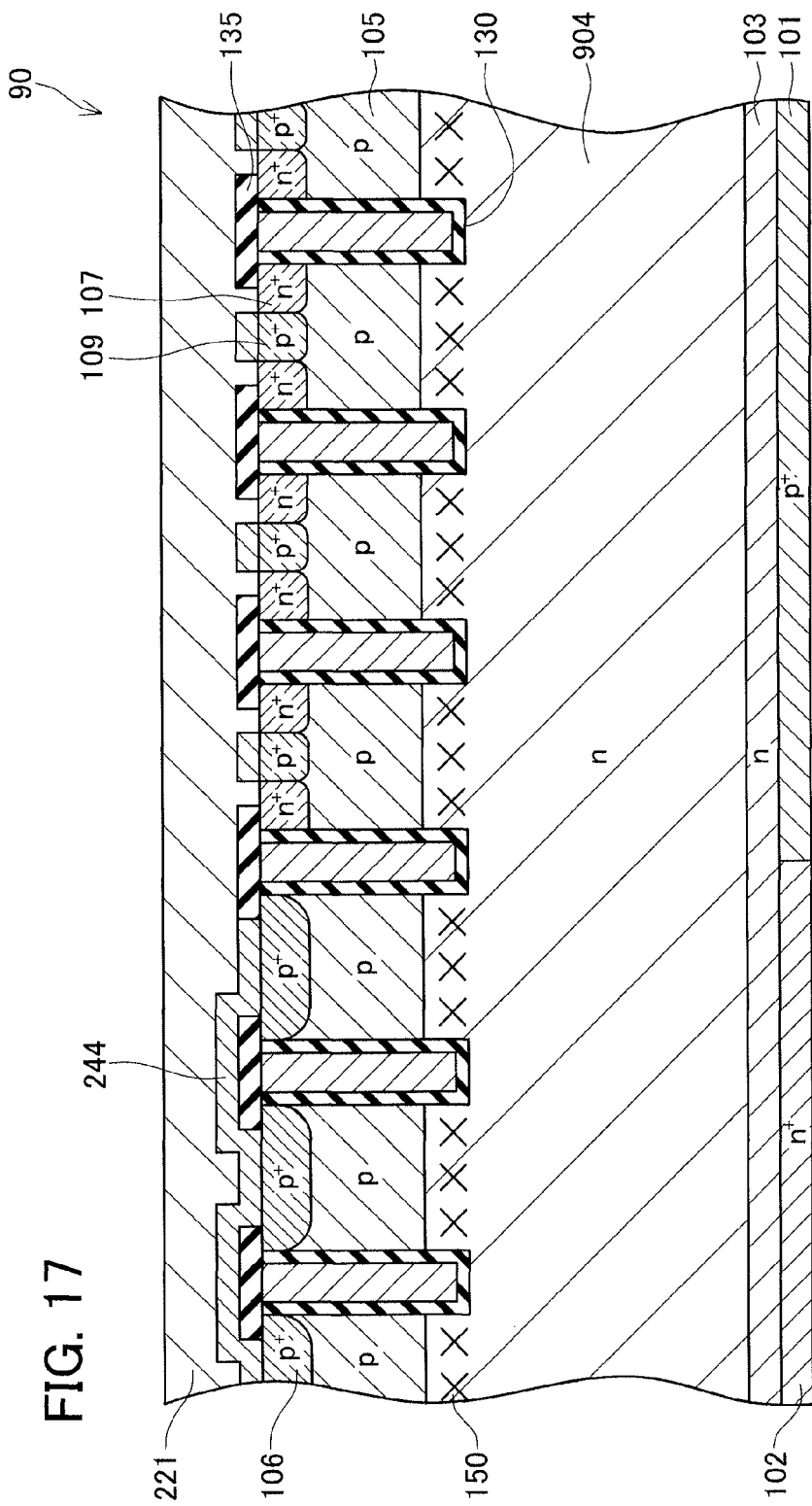
FIG. 17 is a diagram explaining the manufacturing method of the semiconductor device according to Embodiment 2.

Next, as shown in FIG. 17, a lifetime control region 150 is formed by performing annealing for stabilizing the crystal defects in a state in which the barrier metal layer 244 and the Al based electrode layer 221 are present on the front surface of the raw material wafer 90. As in Embodiment 1, in this annealing step, a collector layer 101 of the p type, a cathode layer 102 of the n type, and a buffer layer 103 of the n type are formed. Further, by thus performing the annealing step in a state in which the Al based electrode layer 221 is present, hydrogen atoms are supplied from the Al based electrode layer 221 into the semiconductor substrate 100. Hydrogen atoms thus supplied allows the termination of the interface state present at the boundary between the gate insulating films 132 and the semiconductor substrate 100 to effectively proceed, thus making it possible to effectively reduce the interface state. Further, since the barrier metal layer 244, to which hydrogen atoms are easily adsorbed, is opened on the front surface side of the trench gates 130, to which hydrogen atoms are supplied, the supply of hydrogen atoms from the Al based electrode layer 221 to the trench gates 130 is not prevented by the barrier metal layer 244.

(Modification)

It should be noted that the semiconductor device 20 can be further provided with the silicon nitride film 143 described in Embodiment 1. The interface state is also terminated by hydrogen atoms supplied from the silicon nitride film 143, so that the interface state can be more effectively reduced.

Figure 18:
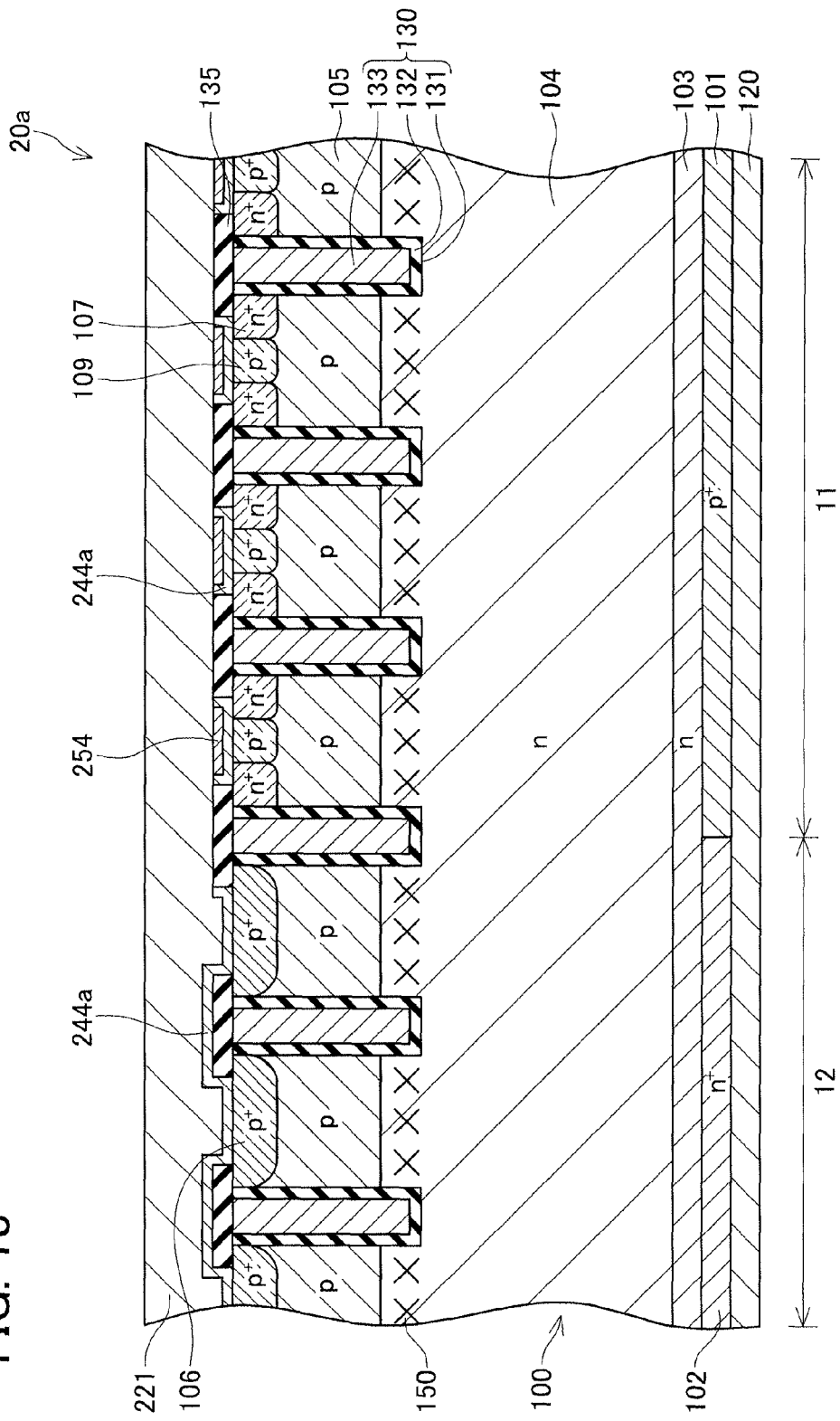
FIG. 18 is a longitudinal sectional view of a semiconductor device according to a modification.

Alternatively, as in a case of a semiconductor device 20a shown in FIG. 18, the front surface electrode may further include a contact plug layer 254 provided between a barrier metal layer 244a and the Al based electrode layer 221. The contact plug layers 254 are provided on a front surface side of the barrier metal layer 244a provided in the IGBT region 11, are embedded in depressed portions of the barrier metal layer 244a, and have their front surfaces covered with the Al based electrode layer 221. The contact plug layers 254 can be suitably made of tungsten or the like. The embedding of the contact plug layers 254 in the depressed portions of the barrier metal layer 244a causes the front surfaces of the barrier metal layer 244a, the contact plug layers 254, and the interlayer insulating film 135 to be flush with one another, thus making it possible to improve the adhesion of these layers to the Al based electrode layer 221.

Figure 19:
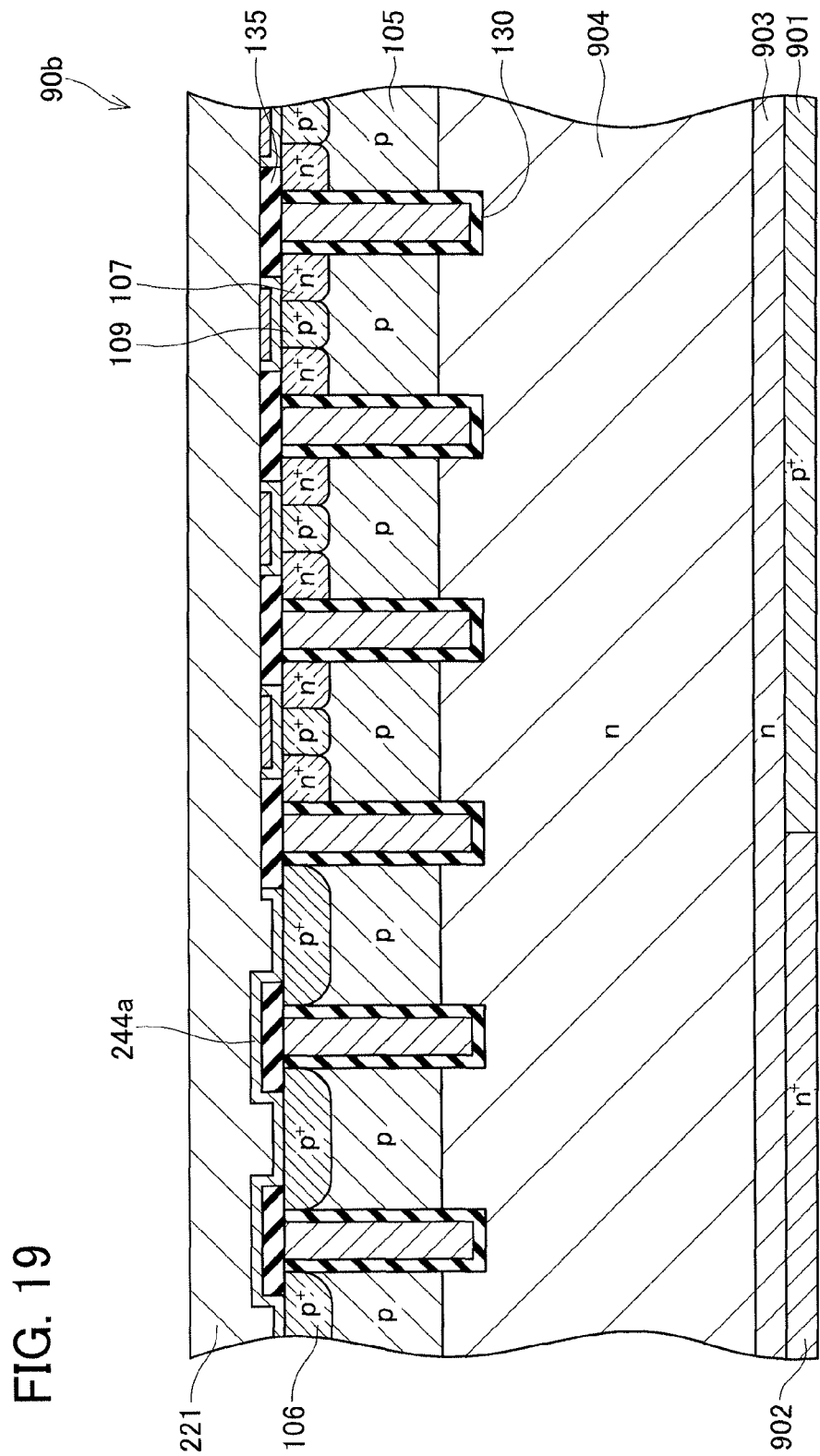
FIG. 19 is a diagram explaining a manufacturing method of the semiconductor device according to the modification.

A semiconductor device 20a can be manufactured by forming a barrier metal layer 244a through the same step as the step of forming the barrier metal layer 244 in the process of manufacturing the semiconductor device 20, performing the step of forming contact plug layers 254, and then performing the step of forming an Al based electrode layer 221 in the process of manufacturing the semiconductor device 20. Specifically, a metal film (e.g., a tungsten film) of which the contact plug layers 254 are to be made is formed by sputtering or the like on a front surface of a raw material wafer 90b on which the barrier metal layer 244a has been formed as shown in FIG. 19. After that, the metal film is patterned so that a portion of the metal film excluding portions embedded in depressed portions of a front surface of the barrier metal layer 244a is removed. Thus, the contact plug layer s254 are formed. Next, as in FIG. 14, the Al based electrode layer 221 is formed by sputtering or the like on the front surface of the raw material wafer 90b in a state in which the contact plug layers 254 have been formed on the front surface of the barrier metal layer 244a. After that, by performing the same steps as those described in Embodiment 2 with reference to FIGS. 15 to 17, the semiconductor device 20a can be manufactured.

Figure 20:
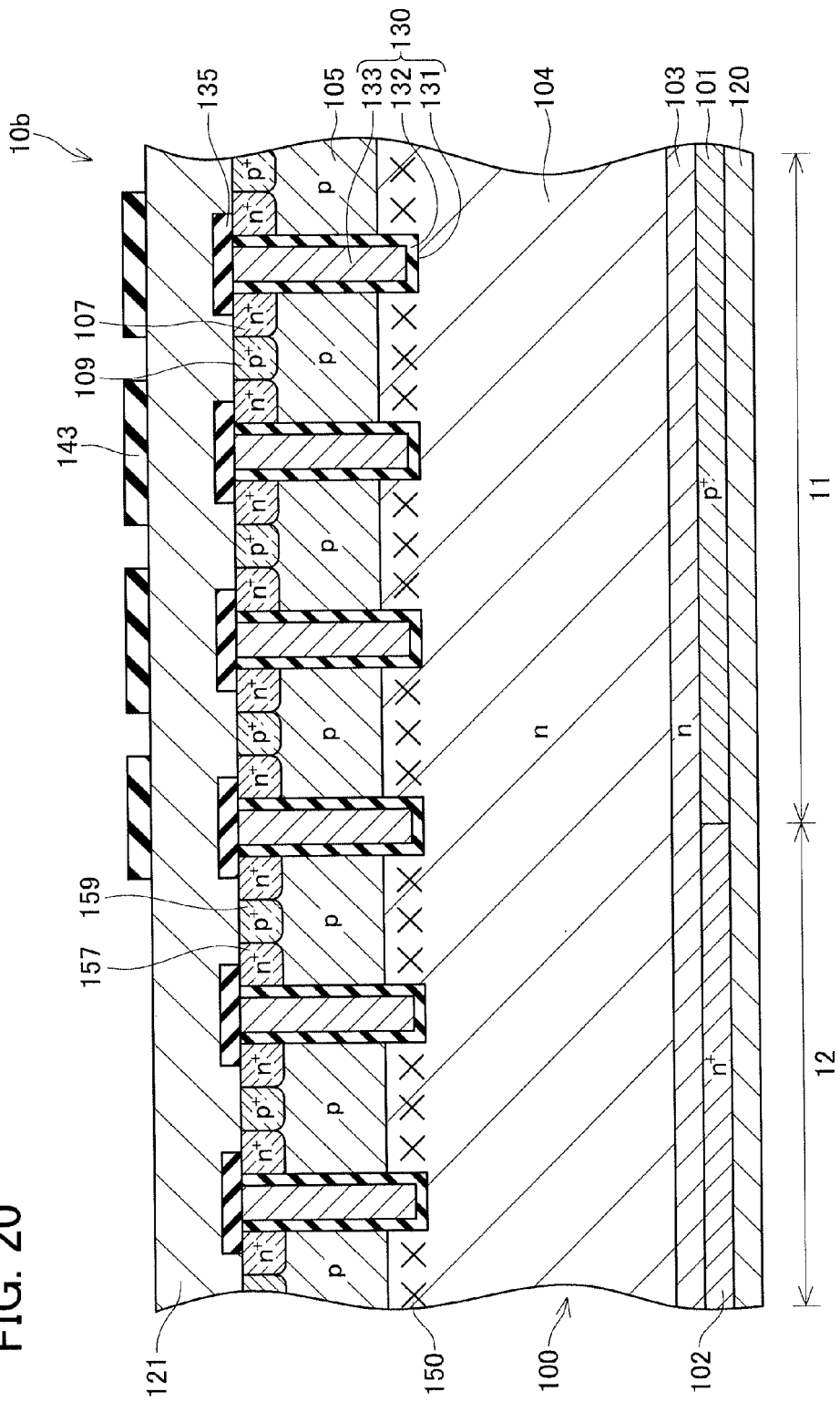
FIG. 20 is a longitudinal sectional view of a semiconductor device according to a modification.

Further, the structures of the IGBT region and the diode region described in the above embodiments and modifications are merely examples, and the technology disclosed herein can be applied to a semiconductor device having a structure of an IGBT region and a structure of a diode region other than those described above. For example, as in a case of a semiconductor device 10b shown in FIG. 20, a structure of the front surface side of the drift layer 104 may be the same for both the IGBT region 11 and the diode region 12. The diode region 12 of the semiconductor device 10b includes diode emitter layers 157 and diode body contact layers 159. In a plan view of the semiconductor substrate 100, the diode emitter layers 157 and the diode contact layers 159 are patterned in the same manner as the emitter layers 107 and the body contact layers 109, respectively. The semiconductor device 10b can be manufactured by a simplified process, as the structure of the front surface side of the drift layers 104 are patterned in the same manner for both the IGBT region 11 and the diode region 12. Furthermore, in the semiconductor device 10b, the silicon nitride film 143 is provided only above the IGBT region 11. However, the silicon nitride film 143 may also be provided above the trench gates 130 and above the diode emitter layers 157 in the diode region 12 (not illustrated).

Figure 21:
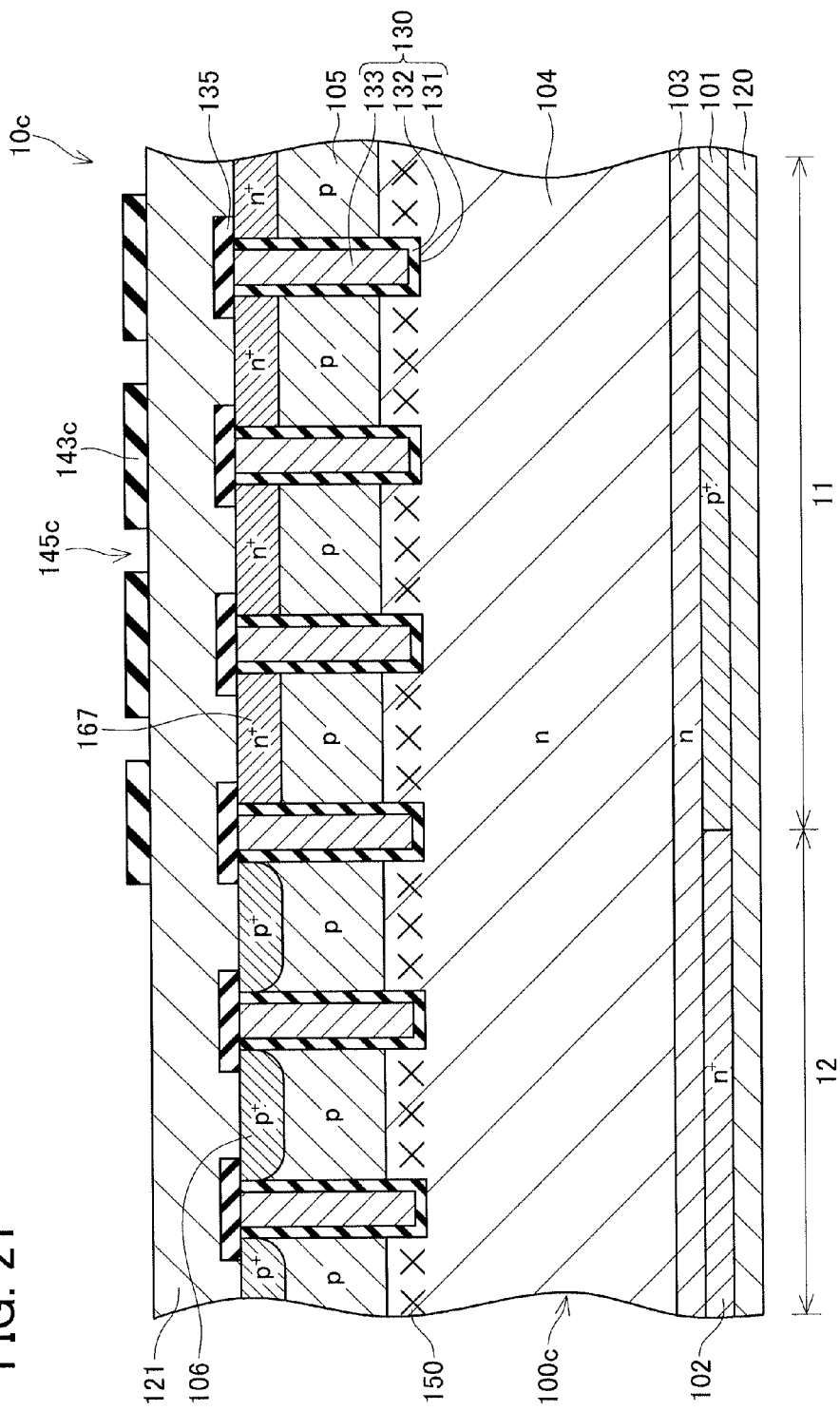
FIG. 21 is a longitudinal sectional view of a semiconductor device according to a modification.
Figure 22:
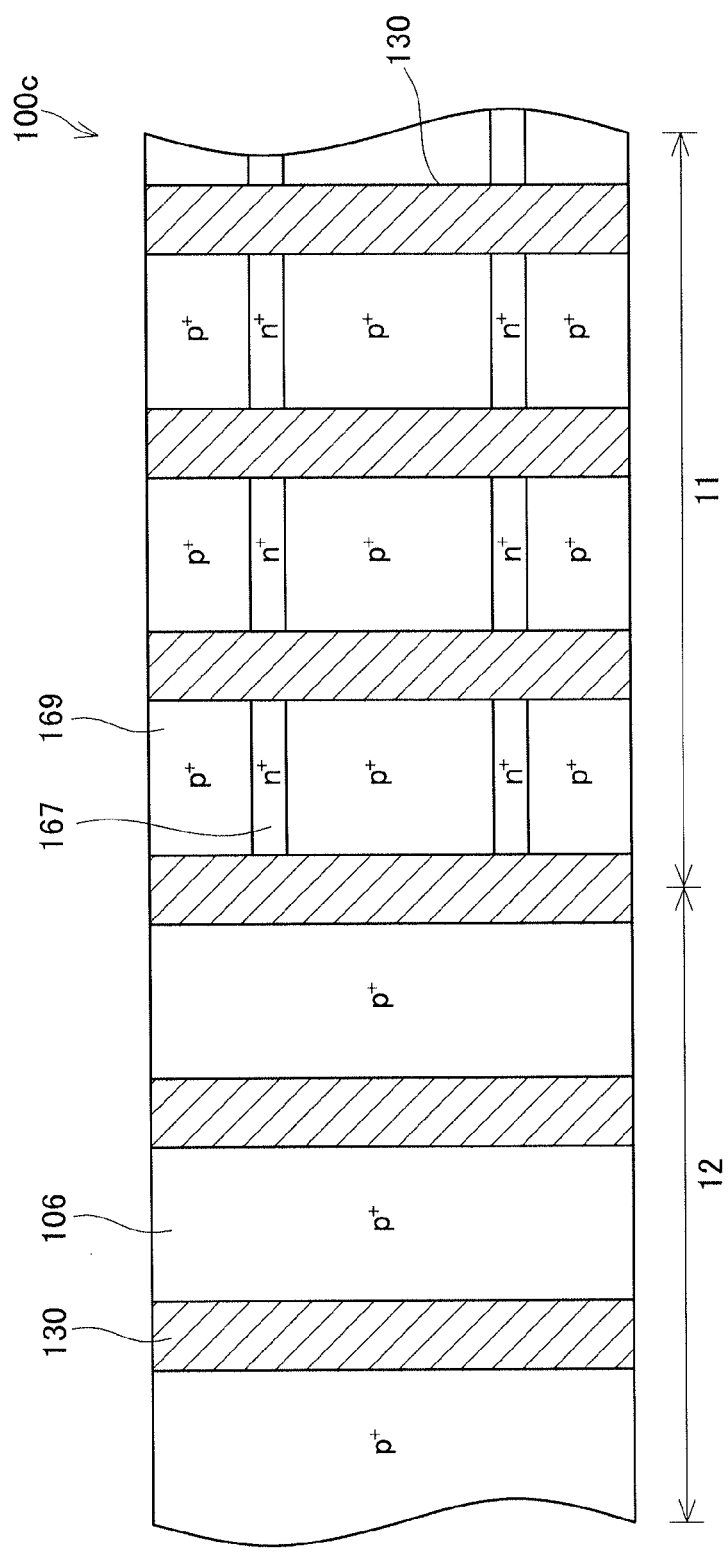
FIG. 22 is a plan view of a semiconductor substrate of the semiconductor device according to the modification.
Figure 23:
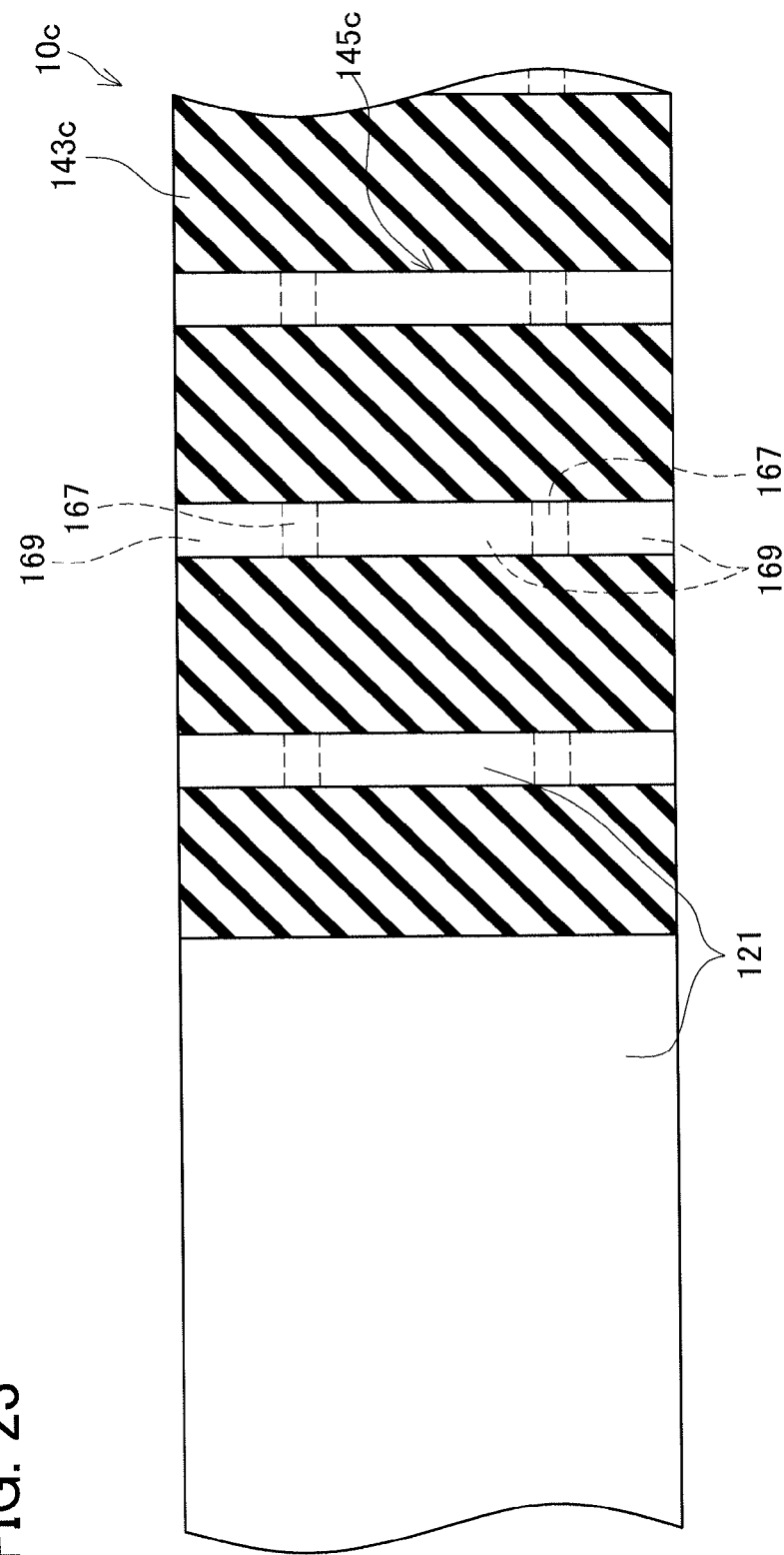
FIG. 23 is a plan view of the semiconductor device according to the modification.

Further, for example, it is possible to include a semiconductor substrate 100c patterned as in a case of a semiconductor device 10c shown in FIGS. 21 to 23. In a plan view of the semiconductor substrate 100c, as shown in FIG. 22, an IGBT region 11 includes emitter layers 167 and body contact layers 169 that are alternately arranged along the longitudinal direction of the trench gates 130. When the semiconductor device 10c is cut along a direction perpendicular to the longitudinal direction of the trench gates 130, there is a case where only the emitter layers 167 appear between adjacent trench gates 130 in the IGBT region 11 as shown in FIG. 21 and a case (not illustrated) where only the body contact layers 169 appear between adjacent trench gates 130 in the IGBT region 11, depending on the positions of the cross-sections.

Further, in the semiconductor device 10c, as shown in FIG. 23, a silicon nitride film 143c is provided on a portion of the front surface of the front surface electrode 121 located within the IGBT region 11, and has openings 145c opened near central positons between adjacent trench gates 130. Located below the openings 145c are portions of the emitter layers 167 and portions of the body contact layers 169. As in a case of the semiconductor device 10c, the silicon nitride film 143c may not be provided vertically above portions of the emitter layers 167, and may be provided vertically above portions of the body contact layers 169.

Embodiments of the present disclosure has been described in detail, however, these are mere exemplary indications and thus do not limit the scope of the claims. The art described in the claims include modifications and variations of the specific examples presented above.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
    a semiconductor substrate in which an insulated-gate bipolar transistor (IGBT) region and a diode region are provided;
    an interlayer insulating film and a front surface electrode that are provided on a front surface of the semiconductor substrate; and
    a back surface electrode provided on a back surface of the semiconductor substrate,
    wherein
    the IGBT region comprises:
    a collector layer of a first conductivity type;
    a first drift layer of a second conductivity type provided on a front surface side of the semiconductor substrate relative to the collector layer;
    a first body layer of the first conductivity type provided on the front surface side of the semiconductor substrate relative to the first drift layer and partially exposed on the front surface of the semiconductor substrate;
    an emitter layer of the second conductivity type provided on a front surface of the first body layer and exposed on the front surface of the semiconductor substrate; and
    a trench gate reaching the first drift layer through the first body layer from the front surface side of the semiconductor substrate,
    the diode region comprises:
    a cathode layer of the second conductivity type;
    a second drift layer of the second conductivity type provided on the front surface side of the semiconductor substrate relative to the cathode layer and having a lower impurity concentration of the second conductivity type than that of the cathode layer; and
    a second body layer of the first conductivity type provided on the front surface side of the semiconductor substrate relative to the second drift layer,
    the interlayer insulating film insulates the trench gate and the front surface electrode,
    a lifetime control region which includes a peak of a crystal defect density is provided in the first drift layer and the second drift layer that are located between a depth of a lower end of the trench gate and top surfaces of the first drift layer and the second drift layer,
    a silicon nitride film is further provided above the trench gate and the emitter layer and below the front surface electrode on the front surface side of the semiconductor substrate, covers the interlayer insulating film, and comprises an opening opened on a portion of the first body layer that is exposed on the front surface of the semiconductor substrate.

2. A manufacturing method of a semiconductor device that comprises:
 a semiconductor substrate in which an insulated-gate bipolar transistor (IGBT) region and a diode region are formed;
 an interlayer insulating film and a front surface electrode that are formed on a front surface of the semiconductor substrate; and
 a back surface electrode formed on a back surface of the semiconductor substrate,
 wherein
 the IGBT region comprises:
 a collector layer of a first conductivity type;
 a first drift layer of a second conductivity type provided on a front surface side of the semiconductor substrate relative to the collector layer;
 a first body layer of the first conductivity type provided on the front surface side of the semiconductor substrate relative to the first drift layer and partially exposed on the front surface of the semiconductor substrate;
 an emitter layer of the second conductivity type provided on a front surface of the first body layer and exposed on the front surface of the semiconductor substrate; and
 a trench gate reaching the first drift layer through the first body layer from the front surface side of the semiconductor substrate,
 the diode region comprises:
 a cathode layer of the second conductivity type;
 a second drift layer of the second conductivity type provided on the front surface side of the semiconductor substrate relative to the cathode layer and having a lower impurity concentration of the second conductivity type than that of the cathode layer; and
 a second body layer of the first conductivity type provided on the front surface side of the semiconductor substrate relative to the second drift layer,
 the interlayer insulating film insulates the trench gate and the front surface electrode,
 a lifetime control region which includes a peak of a crystal defect density is formed in the first drift layer and the second drift layer that are located between a depth of a lower end of the trench gate and top surfaces of the first drift layer and the second drift layer, and
 a silicon nitride film that comprises an opening opened on a portion of the first body layer that is exposed on the front surface of the semiconductor substrate,
 the method comprising:
 forming the trench gate in the semiconductor substrate;
 forming, above the trench gate and the emitter layer and below the front surface electrode on the front surface side of the semiconductor substrate, the silicon nitride film to cover the interlayer insulating film and to comprise the opening opened on the portion of the first body layer that is exposed on the front surface of the semiconductor substrate;
 irradiating charged particles on a region located between a depth of a lower end of the trench gate and top surfaces of the first drift layer and the second drift layer in a state in which the silicon nitride film is present; and
 annealing the semiconductor substrate in the state in which the silicon nitride film is present after irradiating the charged particle.

* * * * *